US012648445B2

(12) United States Patent

Willamson et al.

(10) Patent No.: US 12,648,445 B2
(45) Date of Patent: Jun. 2, 2026

(54) SEMICONDUCTOR DEVICE AND PROCESS WITH CRACK REDUCTION

(71) Applicant: Texas Instruments Incorporated, Dallas, TX (US)

(72) Inventors: Jaimal Mallory Willamson, McKinney, TX (US); Michael Todd Wyant, Dallas, TX (US); Yutaka Suzuki, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 358 days.

(21) Appl. No.: 18/362,894

(22) Filed: Jul. 31, 2023

(65) Prior Publication Data

US 2025/0046733 A1    Feb. 6, 2025

(51) Int. Cl.
H01L 23/00 (2006.01)
H01L 21/78 (2006.01)
H01L 23/31 (2006.01)

(52) U.S. Cl.
CPC ............ H01L 23/562 (2013.01); H01L 21/78 (2013.01); H01L 23/3107 (2013.01); H01L 24/16 (2013.01); H01L 24/81 (2013.01); H01L 2224/16225 (2013.01); H01L 2224/81815 (2013.01)

(58) Field of Classification Search
CPC ... H01L 23/562; H01L 21/78; H01L 23/3107; H01L 24/16; H01L 24/81; H01L 2224/16225; H01L 2224/81815; H01L 23/3114; H01L 23/3128; H01L 23/3142;

H01L 21/561; H01L 21/56; H01L 21/0274; H01L 23/293; H01L 23/3171; H01L 23/3178; H01L 23/3185
See application file for complete search history.

(56) References Cited

U.S. PATENT DOCUMENTS

| | | | |
|---|---|---|---|
| 2020/0058543 A1* | 2/2020 | Han | H01L 23/562 |
| 2021/0391216 A1* | 12/2021 | Yang | H01L 21/0212 |
| 2022/0336366 A1* | 10/2022 | Wirz | H01L 25/0657 |
| 2023/0274978 A1* | 8/2023 | Wyant | H01L 23/544 |
| | | | 257/620 |
| 2024/0079272 A1* | 3/2024 | Lee | H01L 21/78 |

* cited by examiner

*Primary Examiner* — Thanh T Nguyen
(74) *Attorney, Agent, or Firm* — Dawn Jos; Frank D. Cimino

(57) ABSTRACT

An example device includes: a semiconductor die formed on a semiconductor substrate and having a device side surface, a backside surface opposite the device side surface, and having sides between the device side surface and the backside surface at edges of the semiconductor die; the semiconductor die having a device area comprising electrical devices formed on the semiconductor die, and having a scribe spacing area between the device area and the edges of the semiconductor die; the semiconductor die having polymeric anchors in the scribe spacing area, the polymeric anchors being recesses that extend through a protective overcoat dielectric layer that is over the device side surface of the semiconductor die, and extending into the semiconductor substrate of the semiconductor die; and polymeric material covering at least a portion of the semiconductor die, the polymeric material filling the recesses of the polymeric anchors.

21 Claims, 29 Drawing Sheets

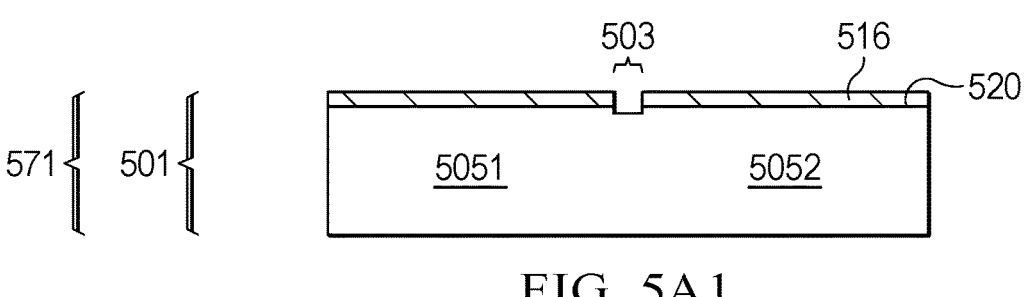
FIG. 5A1
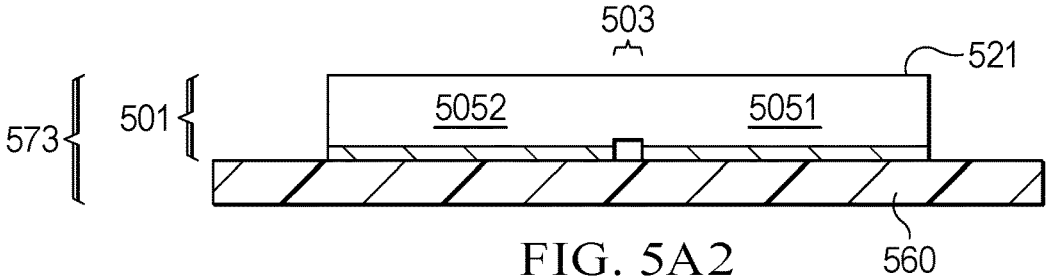
FIG. 5A2
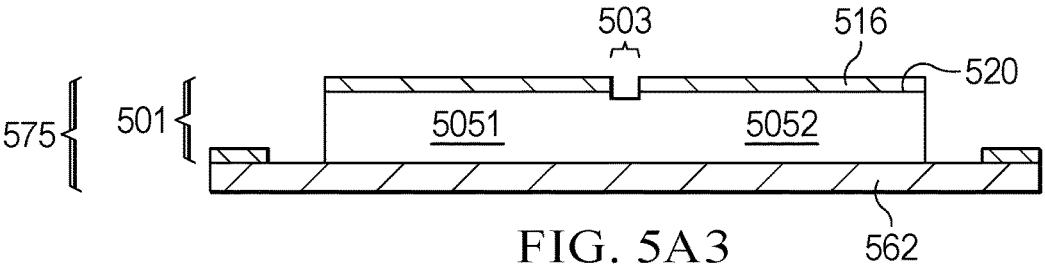
FIG. 5A3
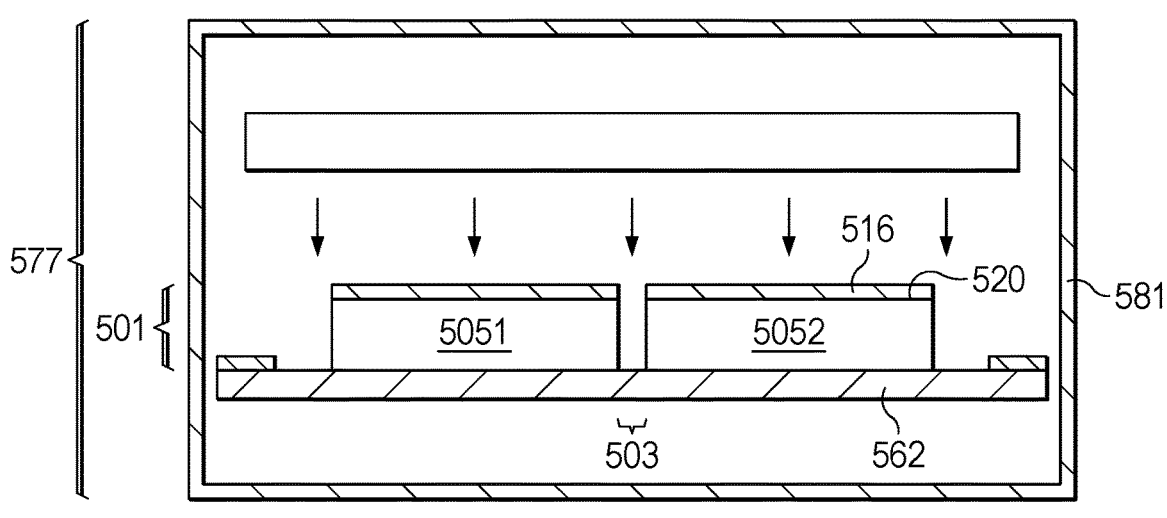
FIG. 5A4

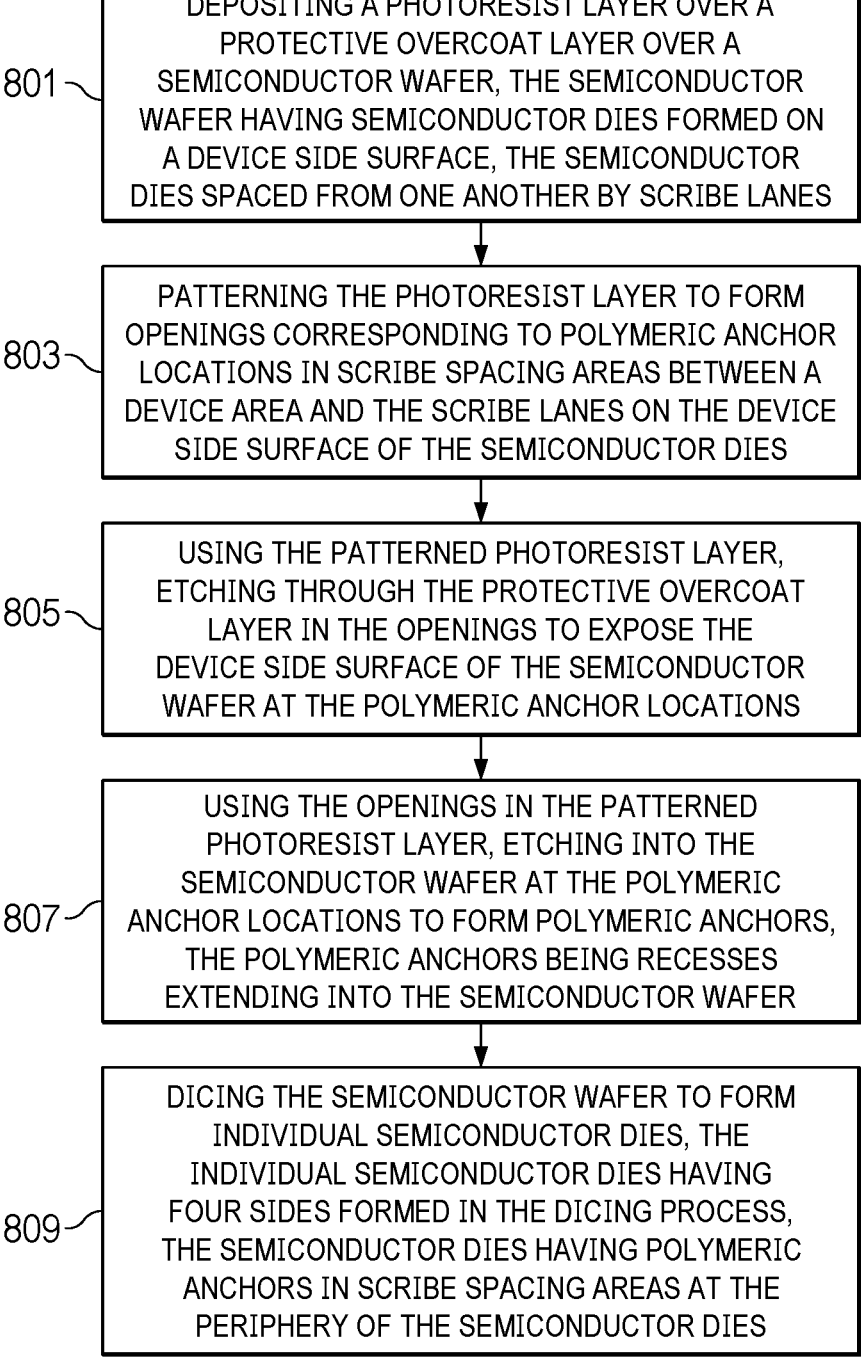

801 — DEPOSITING A PHOTORESIST LAYER OVER A PROTECTIVE OVERCOAT LAYER OVER A SEMICONDUCTOR WAFER, THE SEMICONDUCTOR WAFER HAVING SEMICONDUCTOR DIES FORMED ON A DEVICE SIDE SURFACE, THE SEMICONDUCTOR DIES SPACED FROM ONE ANOTHER BY SCRIBE LANES

803 — PATTERNING THE PHOTORESIST LAYER TO FORM OPENINGS CORRESPONDING TO POLYMERIC ANCHOR LOCATIONS IN SCRIBE SPACING AREAS BETWEEN A DEVICE AREA AND THE SCRIBE LANES ON THE DEVICE SIDE SURFACE OF THE SEMICONDUCTOR DIES

805 — USING THE PATTERNED PHOTORESIST LAYER, ETCHING THROUGH THE PROTECTIVE OVERCOAT LAYER IN THE OPENINGS TO EXPOSE THE DEVICE SIDE SURFACE OF THE SEMICONDUCTOR WAFER AT THE POLYMERIC ANCHOR LOCATIONS

807 — USING THE OPENINGS IN THE PATTERNED PHOTORESIST LAYER, ETCHING INTO THE SEMICONDUCTOR WAFER AT THE POLYMERIC ANCHOR LOCATIONS TO FORM POLYMERIC ANCHORS, THE POLYMERIC ANCHORS BEING RECESSES EXTENDING INTO THE SEMICONDUCTOR WAFER

809 — DICING THE SEMICONDUCTOR WAFER TO FORM INDIVIDUAL SEMICONDUCTOR DIES, THE INDIVIDUAL SEMICONDUCTOR DIES HAVING FOUR SIDES FORMED IN THE DICING PROCESS, THE SEMICONDUCTOR DIES HAVING POLYMERIC ANCHORS IN SCRIBE SPACING AREAS AT THE PERIPHERY OF THE SEMICONDUCTOR DIES

FIG. 8

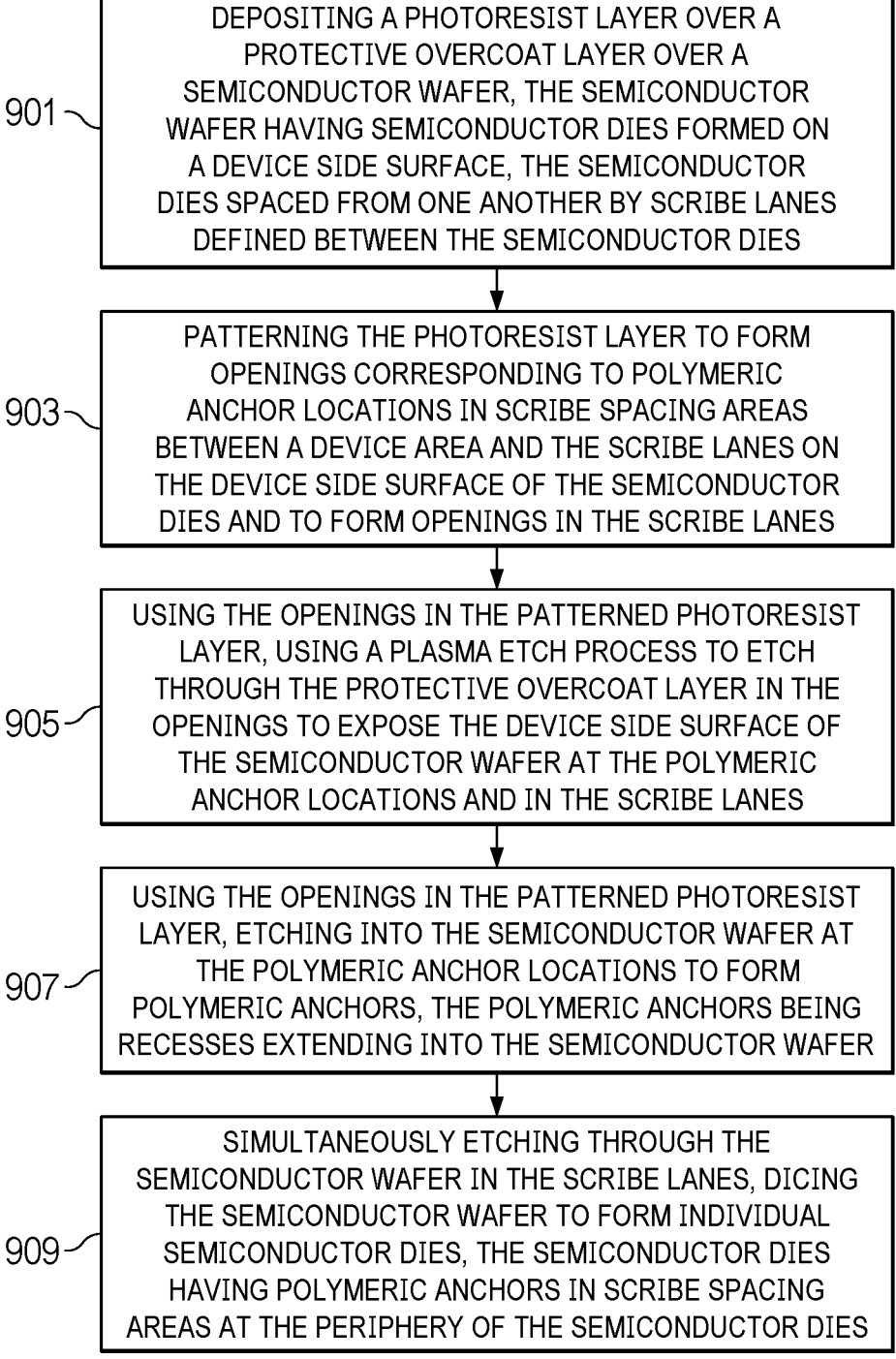

901 — DEPOSITING A PHOTORESIST LAYER OVER A PROTECTIVE OVERCOAT LAYER OVER A SEMICONDUCTOR WAFER, THE SEMICONDUCTOR WAFER HAVING SEMICONDUCTOR DIES FORMED ON A DEVICE SIDE SURFACE, THE SEMICONDUCTOR DIES SPACED FROM ONE ANOTHER BY SCRIBE LANES DEFINED BETWEEN THE SEMICONDUCTOR DIES

903 — PATTERNING THE PHOTORESIST LAYER TO FORM OPENINGS CORRESPONDING TO POLYMERIC ANCHOR LOCATIONS IN SCRIBE SPACING AREAS BETWEEN A DEVICE AREA AND THE SCRIBE LANES ON THE DEVICE SIDE SURFACE OF THE SEMICONDUCTOR DIES AND TO FORM OPENINGS IN THE SCRIBE LANES

905 — USING THE OPENINGS IN THE PATTERNED PHOTORESIST LAYER, USING A PLASMA ETCH PROCESS TO ETCH THROUGH THE PROTECTIVE OVERCOAT LAYER IN THE OPENINGS TO EXPOSE THE DEVICE SIDE SURFACE OF THE SEMICONDUCTOR WAFER AT THE POLYMERIC ANCHOR LOCATIONS AND IN THE SCRIBE LANES

907 — USING THE OPENINGS IN THE PATTERNED PHOTORESIST LAYER, ETCHING INTO THE SEMICONDUCTOR WAFER AT THE POLYMERIC ANCHOR LOCATIONS TO FORM POLYMERIC ANCHORS, THE POLYMERIC ANCHORS BEING RECESSES EXTENDING INTO THE SEMICONDUCTOR WAFER

909 — SIMULTANEOUSLY ETCHING THROUGH THE SEMICONDUCTOR WAFER IN THE SCRIBE LANES, DICING THE SEMICONDUCTOR WAFER TO FORM INDIVIDUAL SEMICONDUCTOR DIES, THE SEMICONDUCTOR DIES HAVING POLYMERIC ANCHORS IN SCRIBE SPACING AREAS AT THE PERIPHERY OF THE SEMICONDUCTOR DIES

FIG. 9

SEMICONDUCTOR DEVICE AND PROCESS WITH CRACK REDUCTION

TECHNICAL FIELD

This disclosure relates generally to semiconductor devices, and more particularly to semiconductor devices produced in a wafer fabrication process and packaged in a semiconductor device package.

BACKGROUND

In manufacturing semiconductor devices using wafer fabrication processes, the semiconductor devices are coated with various materials to protect the transistors, components and routing layers formed in or over the semiconductor substrate in a device area of semiconductor dies. In wafer processing, a number of replicated semiconductor dies are arranged in an array over a device side surface of the semiconductor wafer. The semiconductor dies are formed simultaneously to improve yield and reduce device costs. Wafer processing includes a variety of processes to form transistors and other components, to connect elements to form circuitry, and to form additional metal layers over the semiconductor substrate to couple circuitry together to perform a desired function. The wafer manufacture process can include various processes such as ion implantation, doping, thermal anneals, photolithography, etching, dielectric deposition, metal deposition, planarization, and passivation.

Once the semiconductor devices are completed, the wafer is singulated into individual semiconductor dies. Scribe lanes are formed that run between the semiconductor dies in rows and columns, the scribe lanes are parallel to one another in one direction, and normal to the scribe lanes in the other direction and form a grid. In a mechanical dicing approach, a rotating blade of a dicing saw is used and cuts through the passivation or protective layers over the device side surface of the semiconductor wafer and through the semiconductor wafer in the scribe lanes. A dicing tape or carrier can support the wafer during and after the mechanical dicing. The saw traverses each of the scribe lanes individually to cut through the semiconductor wafer. In operation, chipping and residue from the cutting operation can cause defects in the semiconductor dies. Cracks may start in the scribe lane cut area and propagate laterally into the device area of the semiconductor dies, resulting in scrapped units. Residue from the mechanical sawing operation may fall on the semiconductor dies and must be removed and if not removed successfully, can also cause defective units. In addition, the mechanical dicing saw requires a minimum scribe lane area for sawing of about 60-80 microns, an area where no other structures can be formed, reducing the wafer area available for forming semiconductor devices.

An alternative approach uses lasers. Laser dicing tools are expensive compared to mechanical saws, and like mechanical sawing, the laser dicing process requires a laser to pass over each scribe lane at least once, in a raster pattern or other pattern. The process is time consuming. The laser can cause damage to the edges of the semiconductor dies, and creates a heat affected zone in the semiconductor substrate that can cause additional defects or thermal stress on the semiconductor devices.

An alternative laser approach to laser dicing is stealth laser dicing, where the laser is focused at predetermined depth in the semiconductor wafer in the scribe lanes, but this approach also forms heat affected zones, and requires a mechanical breaking step once the laser forms the stress fractures in the semiconductor substrate, which can also cause cracks along the edges of the semiconductor devices.

Plasma dicing provides an attractive alternative approach. In plasma dicing, a dry etch process, such as a deep reactive-ion etching (DRIE) process, is performed in a plasma chamber. The semiconductor wafer is exposed to active ions in a plasma environment, and the bombarding ions can remove both the protective material such as passivation layers, and using different process gasses, can etch into the semiconductor substrate. By making repeated passes in the process chamber, the semiconductor substrate can be diced. Advantages of the plasma dicing process include that the scribe lanes are all cut through in parallel, increasing throughput and reducing per device costs, and further, the scribe lane required is only 10 microns wide, increasing the number of semiconductor dies manufactured per wafer, reducing per unit costs and increasing yield.

Regardless of which approach is used to singulate the wafer, cracking and delamination defects continue to reduce semiconductor die yields. In forming a semiconductor device package, a polymeric material, such as mold compound, underfill or another insulating encapsulant, is often applied to individual semiconductor dies after the devices are singulated and mounted to a package substrate. The encapsulant covers at least the device side surface of the semiconductor dies, where it is in contact with both polyimide, a stress buffer passivation layer, and in the periphery of the semiconductor dies, in a scribe spacing area between the die edges formed by the dicing tool and the device area, protective overcoat (PO) materials. These PO materials can include dielectric films such as silicon nitride and silicon oxynitride. The encapsulant, which can be an electronic mold compound (EMC), a thermoset resin epoxy material with fillers, or an underfill such as an epoxy with fillers, does not adhere well to the protective overcoat material. Delamination and cracking can occur at the interface between the polymeric material and the PO layer. Cracks that begin in this area can propagate through the protective overcoat layer and into the device area in the central portion of the semiconductor dies, causing scrapped devices in testing or causing failures in the field.

Forming semiconductor devices with reduced delamination and cracking defects is desirable.

SUMMARY

A described method includes: depositing a photoresist layer over a protective overcoat layer over a semiconductor wafer, the semiconductor wafer having semiconductor dies formed on a device side surface, the semiconductor dies spaced from one another by scribe lanes. The method continues by patterning the photoresist layer to form openings corresponding to polymeric anchor locations in scribe spacing areas between a device area and openings corresponding to the scribe lanes on the device side surface of the semiconductor dies. The method uses the patterned photoresist layer and etches through the protective overcoat layer in the openings to expose the device side surface of the semiconductor wafer at the polymeric anchor locations; and using the openings in the patterned photoresist layer, etches into the semiconductor wafer at the polymeric anchor locations to form polymeric anchors, the polymeric anchors being recesses extending into the semiconductor wafer. The method continues by dicing the semiconductor wafer to separate the semiconductor dies to form individual semiconductor dies, the individual semiconductor dies having the polymeric anchors in the scribe spacing areas at a periphery of the individual semiconductor dies.

In a further described example method, the method includes: depositing a photoresist layer over a protective overcoat layer over a semiconductor wafer, the semiconductor wafer having semiconductor dies formed on a device side surface, the semiconductor dies spaced from one another by scribe lanes defined between the semiconductor dies. The method continues by patterning the photoresist layer to form openings corresponding to polymeric anchor locations in scribe spacing areas between a device area and the scribe lanes on the device side surface of the semiconductor dies and to form openings in the scribe lanes. The method continues by using the openings in the patterned photoresist layer, using a plasma etch process to etch through the protective overcoat layer in the openings to expose the device side surface of the semiconductor wafer at the polymeric anchor locations and in the scribe lanes; and using the openings in the patterned photoresist layer. The method uses the plasma etch process to etch into the semiconductor wafer at the polymeric anchor locations to form polymeric anchors, the polymeric anchors being recesses extending into the semiconductor wafer and simultaneously etches through the semiconductor wafer in the scribe lanes, dicing the semiconductor wafer to form individual semiconductor dies, the individual semiconductor dies having the polymeric anchors in scribe spacing areas at the periphery of the individual semiconductor dies.

In a described example, a device includes: a semiconductor die formed on a semiconductor substrate and having a device side surface, a backside surface opposite the device side surface, and having sides between the device side surface and the backside surface at edges of the semiconductor die. The semiconductor die has a device area including electrical devices formed on the semiconductor die, and having a scribe spacing area between the device area and the edges of the semiconductor die. The semiconductor die has polymeric anchors in the scribe spacing area, the polymeric anchors being recesses that extend through a protective overcoat dielectric layer that is over the device side surface of the semiconductor die, and extending into the semiconductor substrate of the semiconductor die. Polymeric material covers at least a portion of the semiconductor die, and the polymeric material fills the recesses of the polymeric anchors.

In another described example, a device includes: a semiconductor die having a device side surface, a backside surface opposite the device side surface, and sides extending between the device side surface and the backside surface at edges of the semiconductor die. The semiconductor die has a device area including electrical devices formed on the semiconductor die, and a scribe spacing area between the device area and the edges of the semiconductor die. The semiconductor die has polymeric anchors in the scribe spacing area, the polymeric anchors being recesses that extend through a protective overcoat dielectric layer that is over the device side surface of the semiconductor die, and extending into the semiconductor substrate of the semiconductor die. The semiconductor die is mounted to a device surface of a package substrate having the device surface and a board side surface opposite the device surface, and having conductive terminals on the board side surface. Polymeric material covers at least a portion of the semiconductor die and at least a portion of the package substrate, the polymeric material filling the recesses of the polymeric anchors, and the terminals are exposed from the polymeric material.

BRIEF DESCRIPTION OF THE DRAWINGS

FIGS. 5A1-5A4 illustrate, in a series of cross-sectional views, a process for dicing of a semiconductor wafer using plasma dicing that is useful with the arrangements.

FIG. 6G illustrates, in a close-up cross-sectional view, details of a semiconductor die including an example arrangement, while

FIG. 8 illustrates, in a flow diagram, steps for forming an arrangement.

FIG. 9 illustrates, in another flow diagram, steps for forming an alternative arrangement.

DETAILED DESCRIPTION

Figure 1A:
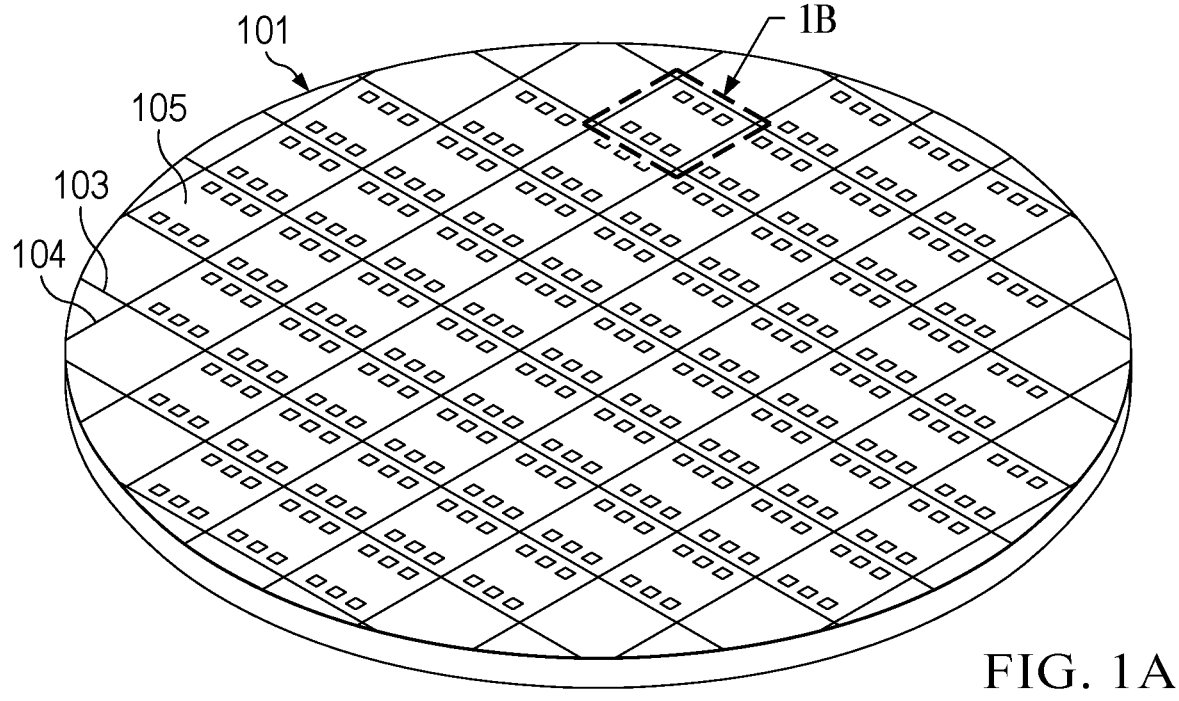
FIGS. 1A-1B illustrate, in a projection view and a close-up projection view, respectively, semiconductor dies on a semiconductor wafer and an individual semiconductor die from the semiconductor wafer that can be used with the arrangements.

Corresponding numerals and symbols in the different figures generally refer to corresponding parts, unless otherwise indicated. The figures are not necessarily drawn to scale.

Elements are described herein as "coupled." The term "coupled" includes elements that are directly connected and elements that are indirectly connected, and elements that are electrically connected even with intervening elements or wires are coupled.

The term "semiconductor device" is used herein. A semiconductor device can be a discrete semiconductor device such as a bipolar transistor, a few discrete devices such as a pair of power field effect transistor ("FET") switches fabricated together on a single semiconductor die, or a semiconductor device can be an integrated circuit with multiple semiconductor devices such as the multiple capacitors in an A/D converter. The semiconductor device can include passive devices such as resistors, inductors, filters, sensors, or active devices such as transistors. The semiconductor device can be an integrated circuit with hundreds or thousands of transistors coupled to form a functional circuit, for example a microprocessor or memory device. The semiconductor device can be a radio transceiver or a radar transceiver. The semiconductor device can be a receiver, transmitter or transceiver. When semiconductor devices are fabricated on a semiconductor wafer and then individually separated from the semiconductor wafer, the individual units are referred to as "semiconductor dies." A semiconductor die is also a semiconductor device.

The term "semiconductor device package" is used herein. A semiconductor device package has at least one semiconductor die electrically coupled to terminals, and has a package body that protects and covers the semiconductor die. The semiconductor device package can include additional elements. Passive components such as capacitors, resistors, and inductors or coils can be included. In some arrangements, multiple semiconductor dies can be packaged together. The semiconductor die is mounted to a package substrate that provides conductive leads; a portion of the conductive leads form the terminals for the packaged device. The semiconductor die can be mounted to the package substrate with a device side surface facing away from the substrate and a backside surface facing and mounted to a die pad of the package substrate. In wire bonded semiconductor device packages, bond wires couple conductive leads of a package substrate to bond pads on the semiconductor die. Alternatively, the semiconductor die can be mounted with a device side facing towards the package substrate using conductive post connects in a flip chip package. A polymeric material can be applied to the device side surface of the semiconductor die after it is mounted to the package substrate. In an example with a flip chip mounted semiconductor die, an underfill can be applied between the device side surface of the semiconductor die and the package substrate. In a molded package, a mold compound can be used to form a package body, the mold compound filling the space between the semiconductor die and the package substrate. The semiconductor device package can have a package body formed by a thermoset epoxy resin in a molding process, or by the use of epoxy, plastics, or resins that are liquid at room temperature and are subsequently cured. The package body may provide a hermetic package for the packaged device. The package body may be formed in a mold using an encapsulation process, however, a portion of the leads of the package substrate are not covered during encapsulation, these exposed lead portions provide the terminals for the microelectronic device package. In an alternative package type useful with the arrangements, a lid or cover by may attached to the package substrate and to the backside of a semiconductor die to form the package body.

The term "package substrate" is used herein. A package substrate is a substrate arranged to receive a semiconductor die and to support the semiconductor die in a completed semiconductor device package. Package substrates useful with the arrangements include conductive lead frames, molded interconnect substrates (MIS), partially etched lead frames, pre-molded lead frames (PMLFs), and multilayer package substrates. Multilayer package substrates can include organic substrates with multiple conductors arranged in a dielectric material to form ball grid array (BGA) or chip scale package (CSP) types, with solder balls on a board side surface arranged for surface mounting to a board or module. In some arrangements, a flip chip semiconductor die mount is used, where post connects or solder bumps that extend from bond pads on the semiconductor device are attached by a solder joint to conductive lands on the device side surface of the package substrate. The post connects can be solder bumps or other conductive materials such as copper or gold with solder on a distal end. Copper pillar bumps can be used. In alternative arrangements using wire bonded packages, bond wires can couple bond pads on the semiconductor dies to the leads on the device side surface of the package substrate. Flip chip BGA packages (FCBGA), flip chip CSP packages (FCCSP) and flip chip on lead (FCOL) packages are useful with and will benefit from the arrangements.

In packaging example microelectronic and semiconductor devices, a polymeric material such as a mold compound or an underfill may be used to partially cover a package substrate, to cover components, to cover a semiconductor die, and to cover the electrical connections from the semiconductor die to the package substrate. The process for applying the polymeric material can be referred to as an "encapsulation" process, although some portions of the package substrates are not covered during encapsulation, for example terminals and leads are exposed to enable electrical connections to the semiconductor device package. Encapsulation is often a compressive molding process, where thermoset mold compound such as epoxy resin can be used. A room temperature solid or powdered electronic mold compound can be heated to a liquid state, and then molding can be performed by pressing the liquid mold compound into a mold through runners or channels. Transfer molding can be used. Unit molds shaped to surround an individual device may be used, or block molding may be used, to form multiple packages simultaneously for several devices from mold compound. The devices to be molded can be provided in an array or matrix of several, hundreds or even thousands of devices in rows and columns that are then molded together.

After the molding or underfill deposition process is complete, the individual semiconductor device packages are cut apart from each other in a sawing operation by cutting through the package substrate in saw streets formed between the devices. Portions of the package substrate leads are exposed from the mold compound package to form terminals for the packaged semiconductor device.

In forming certain FCBGA packages, an underfill material is used on the device side of the semiconductor die around the solder bumps or post connects. The underfill material provides mechanical support to the solder bumps and provides stress relief under thermal cycling to the solder joints between the solder from the die and the device side of the package substrate. The materials of the package substrate can have a coefficient of thermal expansion that is quite different from the CTE of the semiconductor die, creating thermal cycle stress between the materials, in tests and in field use. The underfill is a polymeric material that will contact the protective overcoat (PO) layer directly in the periphery of the semiconductor die.

When underfill is used between the device side surface of a semiconductor die and a package substrate, for example in a flip chip CSP package, the underfill can be an epoxy that is liquid at a process temperature such as 100 degrees C., and can be dispensed along a side or at a corner of the semiconductor die. The underfill flows into and fills the space between the semiconductor die and the package substrate by a capillary action, and surrounds the solder bumps or post connects. The underfill has fillers that can be as much as 60-70% by weight, and the fillers can be silica, for example. The underfill can be cured at an elevated temperature to form a solid that protects the solder joints between the semiconductor die and the package substrate during thermal cycles in testing or in use.

The term "scribe lane" is used herein. A scribe lane is a portion of semiconductor wafer between semiconductor dies. Sometimes in related literature the term "scribe street" is used. Once semiconductor processing is finished and the semiconductor devices are complete, the semiconductor devices are separated into individual semiconductor dies by severing the semiconductor wafer along the scribe lanes. The separated dies can then be removed and handled individually for further processing. This process of removing dies from a wafer is referred to as "singulation" or sometimes referred to as "dicing." Scribe lanes are arranged on four sides of semiconductor dies and when the dies are singulated from one another, rectangular semiconductor dies are formed.

The term "saw street" is used herein. A saw street is an area between molded electronic devices used to allow a saw, such as a mechanical blade, laser, or other cutting tool to pass between the molded electronic devices to separate the devices from one another. This process is another form of singulation. When the molded electronic devices are provided in a strip with one device adjacent to another device along the strip, the saw streets are parallel and normal to the length of the strip. When the molded electronic devices are provided in an array of devices in rows and columns, the saw streets include two groups of parallel saw streets, the two groups are normal to each other, and the saw will traverse the molded electronic devices in two different directions to cut apart the packaged electronic devices from one another in the array.

The term "quad flat no-lead" (QFN) is used herein for a type of electronic device package. A QFN package has conductive leads that are coextensive with the sides of a molded package body, and in a quad flat no-lead package the leads are on four sides. Alternative flat no-lead packages may have leads on two sides or only on one side. These can be referred to as small outline no-lead or SON packages. No-lead packaged electronic devices can be surface mounted to a board. Small outline no-lead (SON) packages can be used with the arrangements. The microelectronic device package of the example arrangements can be mounted to a system board using solder, for example using surface mount technology ("SMT") solder mounting.

The term "scribe spacing area" is used herein. In an example arrangement, a portion of a semiconductor die has a device area where components are formed. In a peripheral area that is between the device area and an outer edge of the semiconductor die, a "scribe spacing area" is formed. When the semiconductor die is part of a semiconductor wafer, the scribe spacing area is between the device area and the scribe lane, and surrounds the device area.

The term "polymeric anchors" is used herein. A polymeric anchor is a recess, cavity or trench that extends from a device side surface of a semiconductor die into the semiconductor substrate, and when a polymeric material such as a mold compound, underfill or other polymeric material is used to cover the device side surface, the polymeric anchor is filled with the polymeric material. In the arrangements, the scribe spacing area includes polymeric anchors. In example arrangements, the polymeric anchors can be formed by an etch before, or simultaneously with, dicing the semiconductor wafer in a dicing tool. In an example process, the polymeric anchors are recesses or cavities formed simultaneously with a plasma dicing process that is performed in a plasma dicing tool. In this example, the polymeric anchors are cavities with scalloped side resulting from the cyclical plasma etch used in plasma dicing. In an alternative process, the polymeric anchors are recesses formed in a plasma processing tool prior to the plasma dicing step and can be an open trench shape, a rectangular recess or trench, a circular recess, cavity or trench. In a further alternative process, the polymeric anchors are recesses formed by an etch process, and subsequently, a plasma dicing process is used to singulate the semiconductor dies from the semiconductor wafer. In a further alternative arrangement, the polymeric anchors are formed by an etch process, and subsequently, the semiconductor wafer can be diced by a plasma dicing tool, a mechanical saw, or a laser cutting tool.

When the semiconductor dies formed in the arrangements are mounted to a package substrate and subsequently covered with a polymeric material used as an encapsulant, such as a mold compound or underfill, the polymeric material extends into and fills the recesses of the polymeric anchors, increasing adhesion. The polymeric anchors are recesses, cavities or trenches that extend through oxides and dielectric layers on the device side surface of the semiconductor die in the scribe spacing area, preventing any cracks that form in the dielectric from propagating laterally into the device area, preventing defects due to cracking. Cracking is more likely in the scribe spacing area where the polymeric material directly contacts protective oxide (PO), which has poor adhesion to the polymeric material. The filled polymeric anchors act as crack stops, increase reliability and reduce scrapped devices.

Figure 1B:
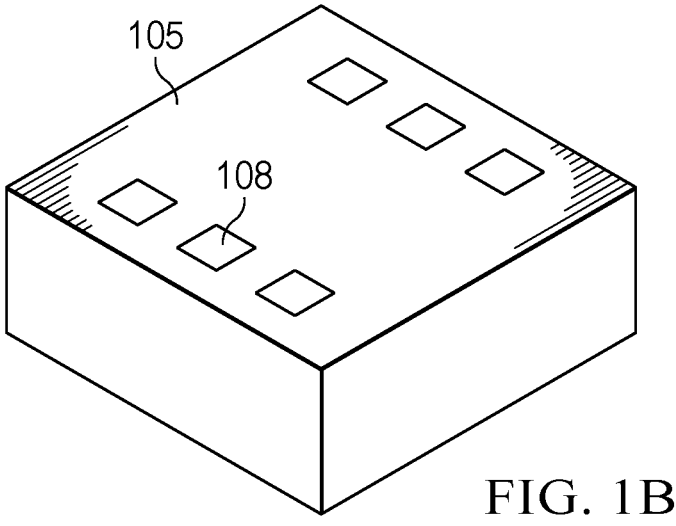

FIGS. 1A and 1B illustrate, in two projection views, a semiconductor wafer having semiconductor die devices formed on it, and an individual semiconductor die, respectively. In FIG. 1A, a semiconductor wafer 101 is shown with an array of semiconductor dies 105 formed in rows and columns on a surface. The semiconductor dies 105 can be formed using processes in a semiconductor manufacturing facility, including ion implantation, doping, anneals, oxidation, dielectric and metal deposition, photolithography, pattern, etch, chemical mechanical polishing (CMP), electroplating, and other processes for making semiconductor devices. Scribe lanes 103 and 104, which are perpendicular to one another, and which run in parallel groups across the wafer 101, separate the rows and columns of the completed semiconductor dies 105, and provide areas for dicing the wafer 101 to separate the semiconductor dies 105 from one another.

FIG. 1B illustrates a single semiconductor die 105 taken from semiconductor wafer 101. Semiconductor die 105 includes bond pads 108, which are conductive pads that are electrically coupled to devices (not shown) formed in the semiconductor die 105. The semiconductor dies 105 are then separated by dicing, or are singulated, using the scribe lanes 103, 104 (see FIG. 1A).

Figure 2:
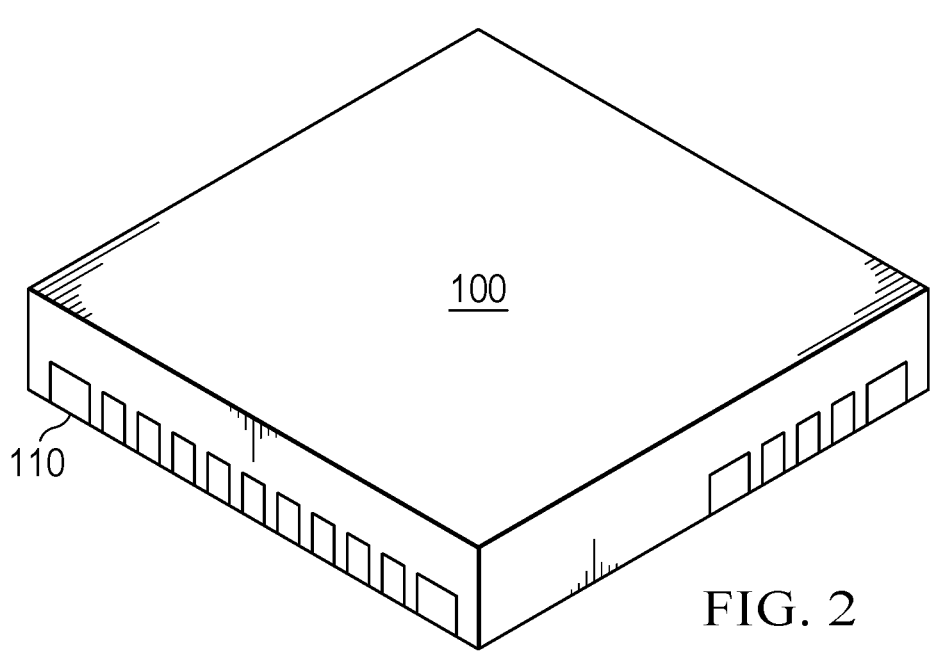
FIG. 2 illustrates, in a projection view, a top side surface of a quad flat no-lead (QFN) semiconductor device package useful with the arrangements.

FIG. 2 illustrates, in a projection view from a topside surface, a semiconductor device package 100 that is useful with the arrangements. In FIG. 2, the semiconductor device package 100 illustrated is a quad flat no-lead semiconductor device package with terminals 110. The terminals 110 can be formed as portions of leads of a lead frame (not visible) that is a package substrate. In an example, a pre-molded lead frame (PMLF) is used, or a molded interconnect substrate (MIS) is used. Terminal portions of the leads are exposed on a board side surface, and sometimes on a side portion of the semiconductor device package as shown in FIG. 2, and the remaining portions of the leads are partially surrounded by a dielectric such as a resin, epoxy, or an electronic mold compound. Thermoplastic material can be used. A thermoset film, such as Ajinomoto build-up film available from Ajinomoto Co. Ltd., of Tokyo, Japan, can be used as the dielectric. In an example, the leads can be a copper or copper alloy. Portions of the terminals can be plated with palladium, nickel, gold, platinum, silver, alloys or combinations of these to enhance solderability, and reduce tarnish and corrosion. The exposed terminals can be tinned for soldering. The semiconductor device package 100 is arranged for mounting to a system board or printed circuit board (PCB) by surface mount technology (SMT), where a solder is applied to the devices to form electrical connections between the terminals 110 and conductor traces or conductive lands on a system board, which also mechanically attaches the semiconductor device package 100 to the system board.

Figure 3A:
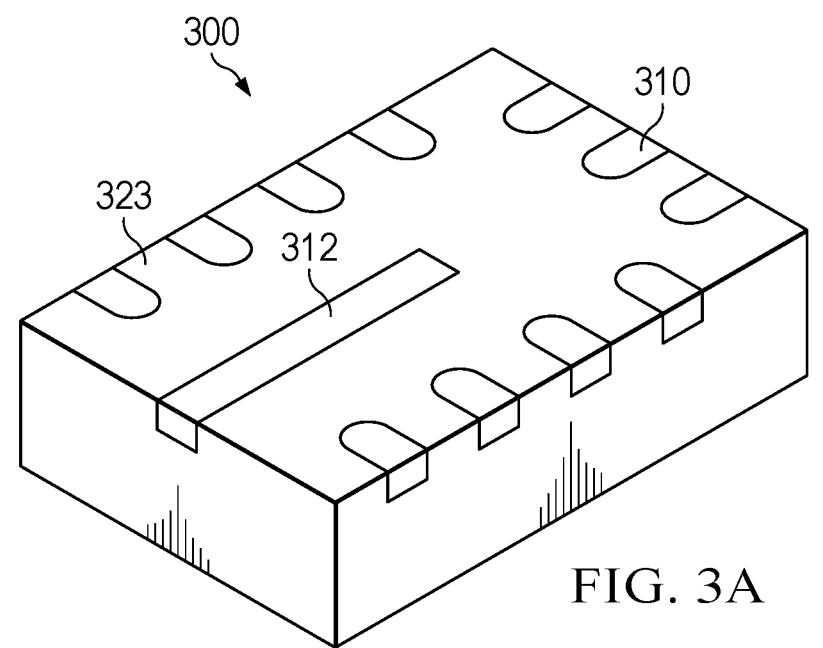
FIG. 3A illustrates, in a projection view, a board side surface of an alternative quad flat no-lead package useful with the arrangements.

FIG. 3A illustrates, in a projection view taken from a board side surface, an alternative semiconductor device package 300 which is useful with an arrangement. In FIG. 3A, the semiconductor device package 300 is a "flip chip on lead" or "FCOL" type no-lead package. FIG. 3A illustrates a semiconductor device package available from Texas Instruments Incorporated of Dallas, Texas, referred to as a HotRod™ package. Terminals 310 carry signals, and the rail 312 can be a ground or voltage supply terminal. When a high voltage semiconductor device such as power field effect transistor (power FET) is mounted in the semiconductor device package 300, multiple bond pads of the semiconductor die can be mounted in parallel to the rail 312, providing a low resistance path to ground or another potential, and carrying thermal energy out of the semiconductor device within the mold compound 323 of the semiconductor device package 300. The terminals 310 and the rail 312 are exposed from the mold compound for surface mounting to a board or module. FCOL packages such as the semiconductor device package 300 can be made smaller than conventional QFN packages because there is not a die pad or paddle to carry the semiconductor die, as is the case in a face up wire bonded package, saving board area and reducing package sizes.

Figure 3B:
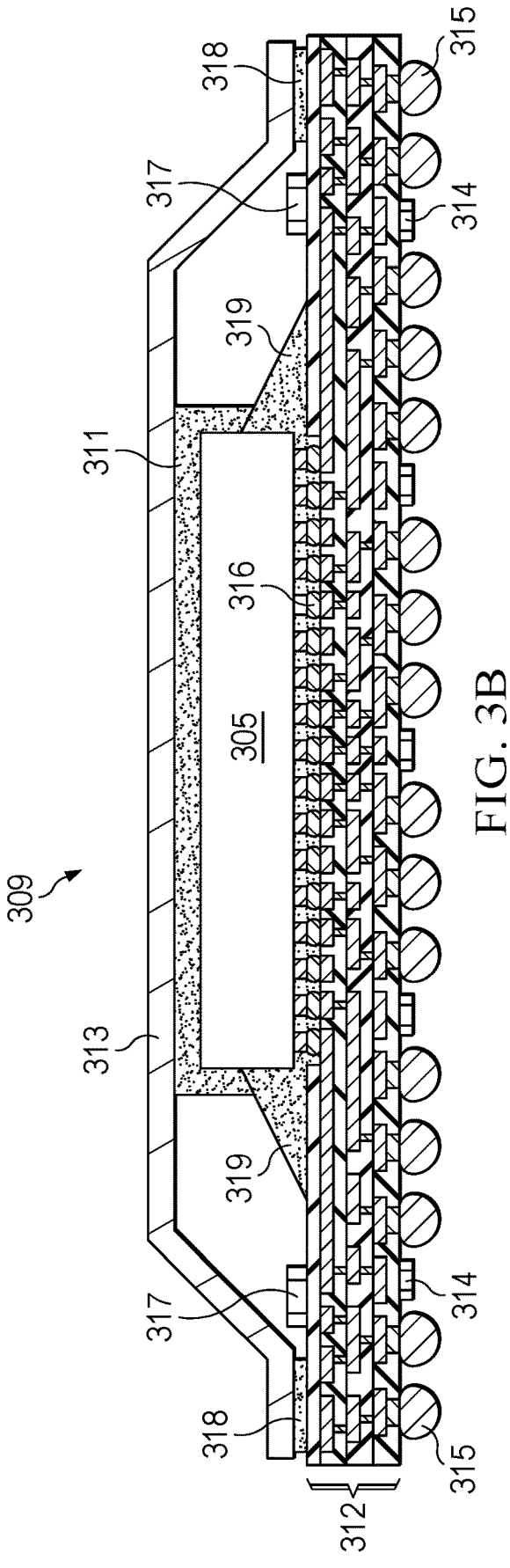
FIG. 3B illustrates, in a cross-sectional view, a flip chip ball grid array (FCBGA) package that can is useful with the arrangements.

FIG. 3B illustrates, in a cross-sectional view, a FC-BGA package 309 that can be used with the arrangements. In FIG. 3B, the FC-BGA package 309 has a semiconductor die 305 that is flip chip mounted to a package substrate 312. In this example the package substrate 312 is a multilayer package substrate that is arranged to provide ball grid array solder balls 316 on a board side surface for surface mounting the FC-BGA package 309 to a board. The semiconductor die 305 has solder balls or bumps 316 that form mechanical connection and electrical connection between the semiconductor die 305 and the package substrate 312. A cover or lid 313 protects the semiconductor die 305 and the package substrate 312. A thermal interface material 311, which can be thermally conductive, is used to attach the lid to the backside surface (facing upwards in FIG. 3B, as the semiconductor die 305 is flip chip mounted to the package substrate 312). A lid seal or adhesive 318 attaches the lid or cover 313 (which can be a heat sink to transfer heat from the FC-BGA package 309) to the package substrate 312. The package substrate 312 can mount external passives such as capacitors 314 on a board side surface, and internal passives such as capacitor 317 on a device surface. An underfill material 319 is shown which is formed between the device side surface of the semiconductor die 305 and which protects the solder bumps 316 from mechanical stress. The underfill material 319 can be dispensed under the semiconductor die 305 after the semiconductor die is placed on the package substrate 312. The underfill material 319 can be an epoxy, resin epoxy, or silicone. In an example process an epoxy with silica fillers is used. The epoxy can be dispensed as a liquid at a process temperature of about 100 degrees C., and can be dispensed along the edges of the semiconductor die 305 between the semiconductor die 305 and the package substrate 312. Under capillary action, the underfill epoxy will flow under and fill the space between the semiconductor die 305 and the package substrate 312, and will surround the solder bumps 316. The underfill epoxy can be cured at an elevated temperature to harden into a solid. In areas of the semiconductor die 316 near the periphery of the semiconductor die, the underfill epoxy, a polymeric material, will directly contact the protective overcoat layer on the semiconductor die 305.

Figure 3C:
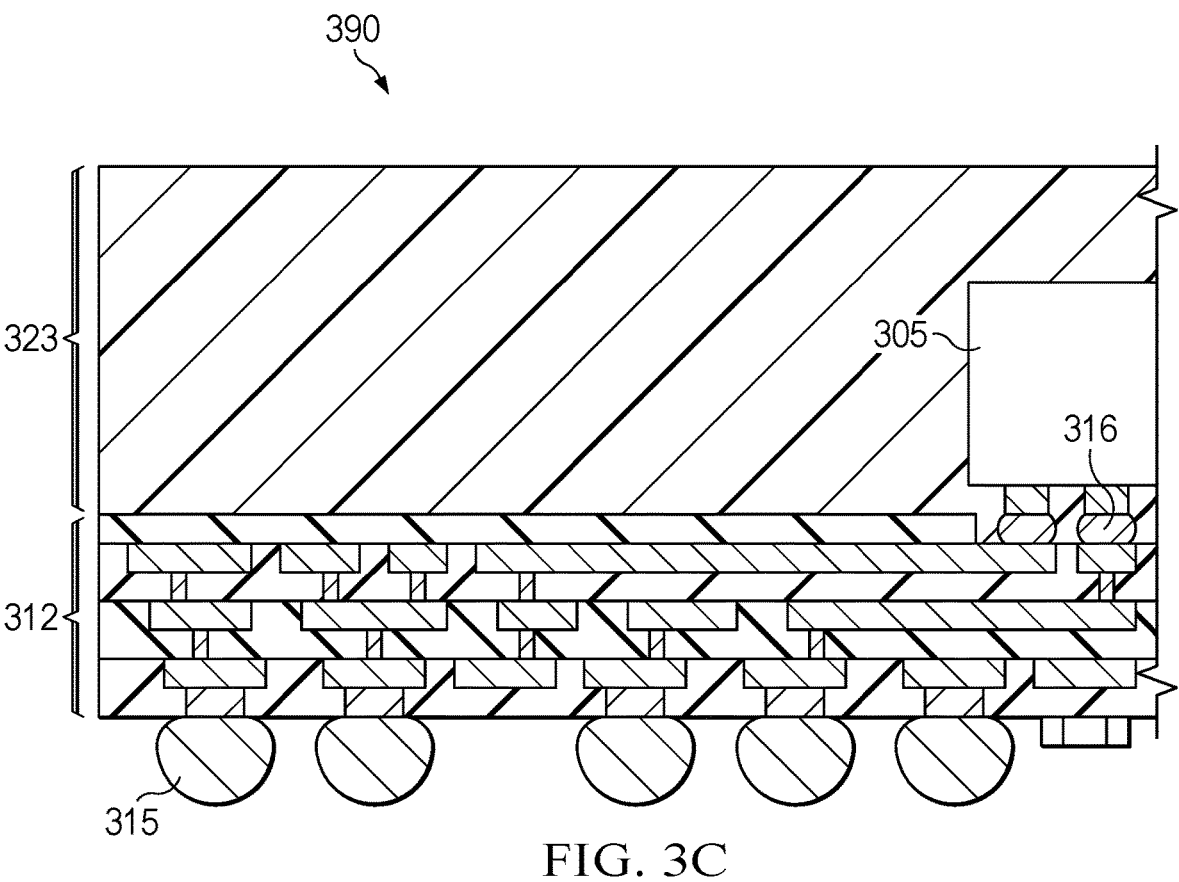
FIG. 3C illustrates, in another cross-sectional view that is a partial view, a flip chip chip scale package (FCCSP) package that is useful with the arrangements.

FIG. 3C illustrates, in another cross-sectional view that is a partial view, in an alternative example, a flip chip chip scale package (FCCSP) package 390. In FIG. 3C, the semiconductor device package 390 has a semiconductor die 305 mounted to a package substrate 312 that carries solder balls 315 on a board side surface. The semiconductor die 305 is flip chip mounted to a device side of the package substrate 312 using solder bumps or post connects 316. Mold compound 323 is formed covering the device side of the package substrate 312, and covering the semiconductor die 305. At the periphery of semiconductor die 305, the mold compound 323 will directly contact a protective overcoat layer on the device side surface of the semiconductor die 305.

Figure 4A:
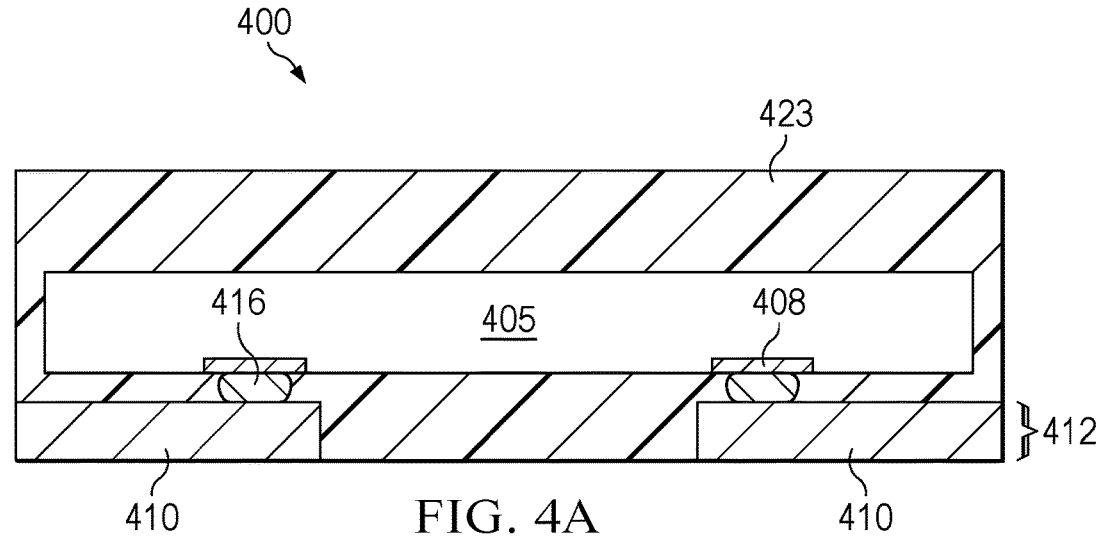
FIG. 4A illustrates, in a cross-sectional view, a semiconductor device package that is a flip chip on lead (FCOL) no-lead package useful with the arrangements.

FIG. 4A illustrates, in a cross-sectional view, a no-lead semiconductor device package 400 similar to the semiconductor device package 300 in FIG. 3A. This no-lead semiconductor package 400 is used as an illustrative example, however, in other arrangements, a FCCSP package, or a FCBGA package, is used. In the arrangements, a polymeric material, such as an underfill or a mold compound, contacts a protective overcoat layer of a semiconductor die directly in a scribe spacing area at the periphery of the semiconductor die. A semiconductor die 405, similar to the semiconductor die 105 of FIG. 1B, is shown flip chip mounted to a package substrate 412. Although an example FCOL type package substrate is shown, in additional arrangements, the package substrate can be an organic multilayer package substrate such as a FCCSP package substrate, or a FCBGA package substrate.

In FIG. 4A, solder bumps 416 extend from bond pads 408 on the semiconductor die 405 and are shown in a flip-chip on lead (FCOL) configuration, the solder bumps 416 electrically connect the bond pads 408 of the semiconductor die 405 to the terminals 410 of the package substrate 412.

Figure 4B:
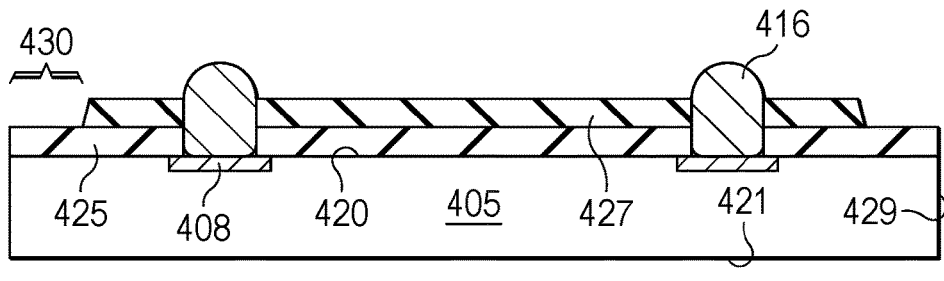
FIG. 4B illustrates, in another cross-sectional view, a semiconductor die with solder bumps extending from a device side surface.

FIG. 4B illustrates, in another cross-sectional view, the semiconductor die 405 and solder bumps 416 of FIG. 4A in more detail. In FIG. 4B the semiconductor die 405 is shown prior to being mounted in a semiconductor device package. Semiconductor die 405 is shown arranged with a device side surface 420 facing upwards (as oriented in FIG. 4B), and a backside surface 421 facing downwards. Solder bumps 416 are shown extending from bond pads 408. A protective overcoat (PO) layer 425 is shown over the device side surface 420 of the semiconductor die 405. A polyimide layer (PI) 427 is shown over portions of the semiconductor die 405 and covering portions of the PO layer 425. The semiconductor die 405 has sides 429, which are formed when a semiconductor wafer (see FIG. 1A, wafer 101) is cut apart along scribe lanes (see 103, 104 in FIG. 1A) and the sides 429 are the boundary of the semiconductor die 405 formed along the scribe lanes. The polyimide layer 427 does not extend all the way to the sides 429. This is done to enable the dicing operation to cut through the semiconductor wafer in the scribe lanes without having to cut through the polyimide layer. The protective overcoat (PO) layer 425, which can be an inorganic dielectric such as silicon nitride (SiN), silicon oxynitride (SiON), or another dielectric, extends over the surface of the semiconductor die. The area between a device area in the central portion of the semiconductor die 405 and the periphery of the semiconductor die 405 is referred to herein as a "scribe spacing area" 430, which extends between the device area and the sides 429. The scribe spacing area is covered or mostly covered by the PO layer 425. In some examples, scribe seals can be formed at the periphery of the semiconductor die 405, these are vertical structures formed of metal layers and vias between metal layers and will be located near the side 429 in the scribe spacing area 430. Scribe seals can prevent cracks formed in a dicing operation from propagating from the side 429 of the semiconductor die into the layers beneath the protective overcoat 425, scribe seals are shown in more detail below.

Solder bumps 416 can be formed in a wafer bumping process while the semiconductor dies are still part of a semiconductor wafer (see FIG. 1A, wafer 101 with semiconductor dies 105, for example). Solder can be applied to the bond pads by a stencil, by solder ball dropping, by ink jet or drop on demand technology, and subsequently heated to reflow into the solder bump shapes. Alternative processes include using a reconstituted wafer after wafer dicing, so that the individual dies are placed on a support film or tape by pick and place tools, and then a bumping operation can be performed on the reconstituted wafer, thus allowing for greater spacing between devices during the bumping processes.

Figure 4C:
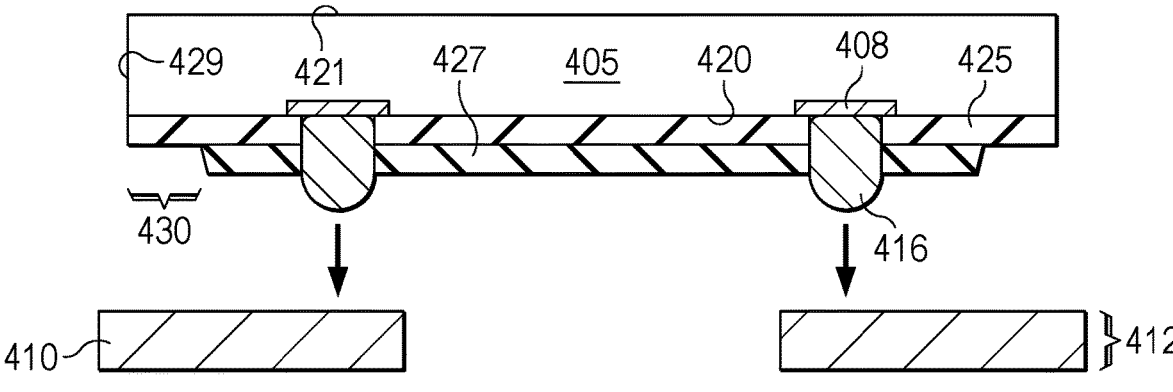
FIG. 4C illustrates, in a cross-sectional view, a die mounting step for the semiconductor die of FIG. 4B on a package substrate.

FIG. 4C illustrates, in another cross-sectional view, a die mounting process for the semiconductor die 405. The semiconductor die 405 is arranged with the device side surface 420 facing a device side of package substrate 412. The solder bumps 416 extending from the bond pads 408 are positioned to be placed in contact with terminals 410 on the device side of the package substrate 412. The PO layer 425 and the PI layer 427 are shown.

Figure 4D:
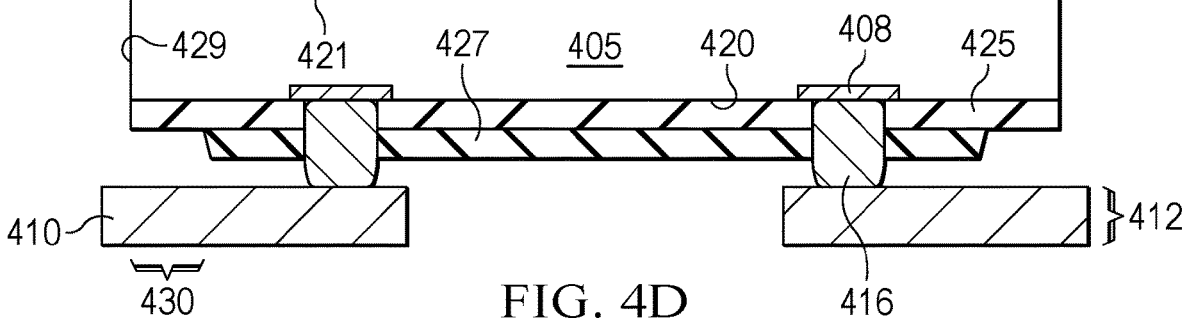
FIG. 4D illustrates, in another cross-sectional view, the semiconductor die and package substrate of FIG. 4C after a solder reflow process.

FIG. 4D illustrates the elements of FIG. 4C after an additional processing step. In FIG. 4D, the semiconductor die 405 is shown mounted to the package substrate 412. Solder bumps 416 form solder joints with terminals 410 of the package substrate 412 in a thermal reflow process. The protective overcoat layer 425 and the polyimide layer 427 are shown spaced from the device surface of the package substrate 412.

Figure 4E:
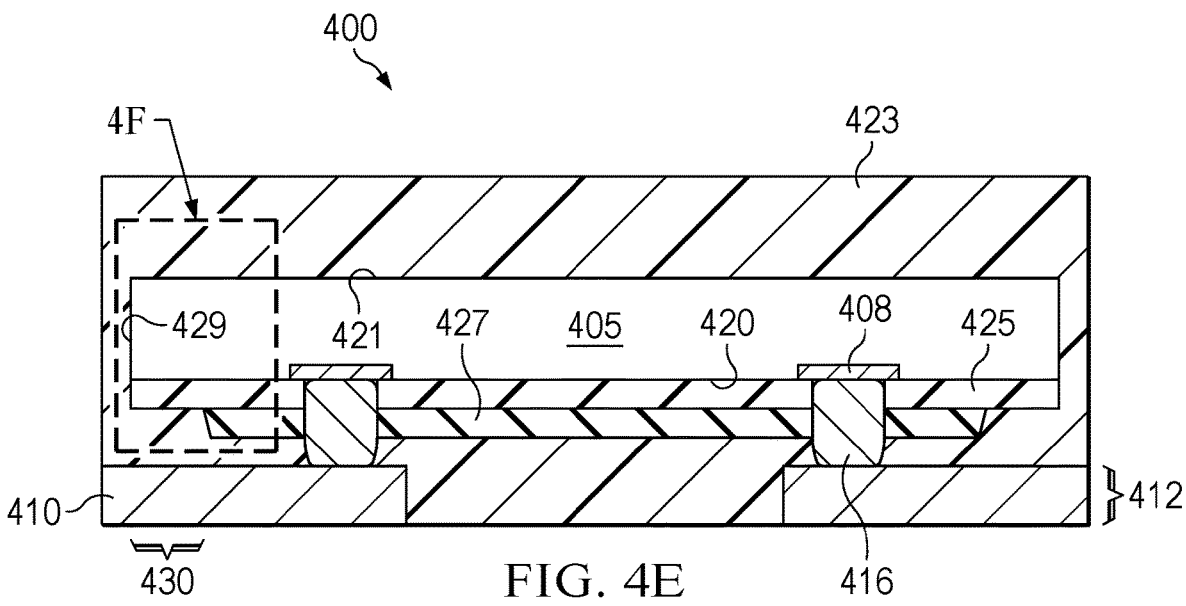
FIG. 4E illustrates, in another cross-sectional view, the semiconductor die and package substrate of FIG. 4D after a molding process.

FIG. 4E illustrates the elements of FIG. 4D after an encapsulation or molding process deposits polymeric material over the semiconductor die. In the example shown in FIG. 4E, semiconductor die 405 is shown with mold compound 423 over the backside surface 421 and over the sides 429 of the semiconductor die 405. The mold compound 423 covers portions of the package substrate 412 including the device surface of terminals 410, and spaces between terminals 410. The mold compound 423 is in contact with the protective overcoat layer 425 in the scribe spacing area 430 between the side 429 and a device area covered by the polyimide 427. In an alternative arrangement, for example see semiconductor device package 309 in FIG. 3B, when an underfill material is used, at least the device side surface 420 of the semiconductor die 405 will be covered with the underfill. The underfill in that example will directly contact the PO layer 425.

In an example molding process when mold compound is used as the polymeric material for encapsulation, semiconductor dies are mounted to a device surface of package substrates (such as 412) that are arranged in a strip or an array or matrix. Tens, hundreds or more semiconductor die devices can be molded contemporaneously to increase throughput, and then the molded packages are separated into individual semiconductor device packages. The package substrates carrying the semiconductor dies can be loaded into a mold chase of a transfer molding tool. A thermoset resin epoxy mold compound such as electronic mold compound (EMC) can be used in the transfer molding operation. The EMC can be provided as a solid puck or as a powder that is solid at room temperature. The EMC can be heated to a liquid state. A mechanical ram can be used to force the liquid mold compound under pressure into the mold chase through runners. The mold compound flows into and fills the mold chase surrounding the semiconductor devices and portions of the package substrates. The mold compound is cured to a solid state and forms the body of the semiconductor device package 400. Portions of the leads in the package substrate are left exposed from the mold compound to form terminals 410, for example.

The protective overcoat layer 425 can be a dielectric such as a silicon oxide, a silicon oxynitride, or a silicon carbide, for example. The polyimide layer 427 acts as a stress buffer between the mold compound 423 and the protective overcoat layer 425 in the device area of the semiconductor die 405, however in the scribe spacing area 430 between the side 429 of the semiconductor die 405 (the side 429 is formed in a dicing operation from the wafer) and the device area, the mold compound 423 contacts the PO layer 425 directly. The mold compound 423 does not readily adhere to the PO layer 425. The weak adhesion at the interface between the different materials can cause cracks to form during thermal cycle (TC) tests or in the field. The area labeled "FIG. 4F" in FIG. 4E is shown in a close-up view in FIG. 4F to illustrate an example of cracking that might occur.

Figure 4F:
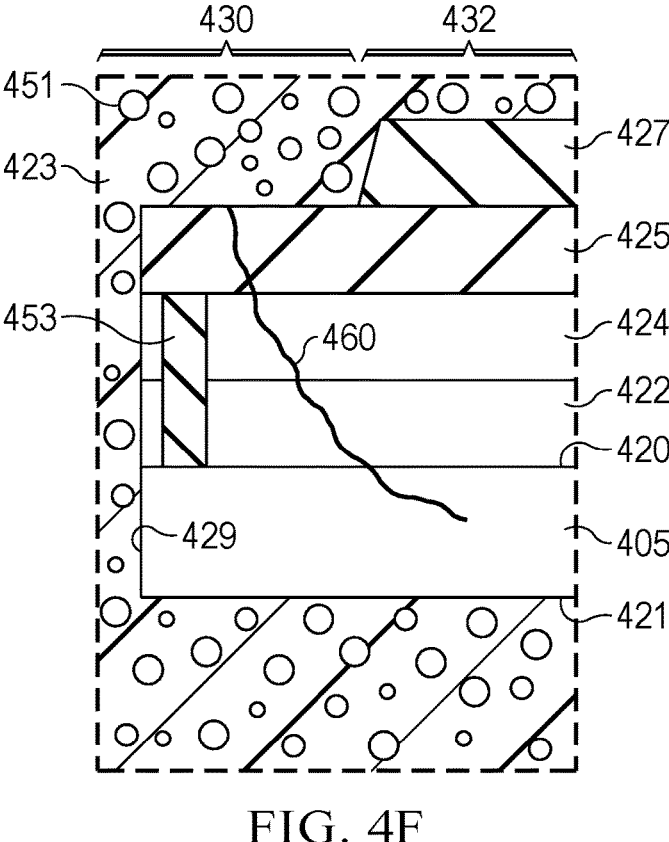
FIG. 4F illustrates, in a cross-sectional view, a close-up view of a side of the semiconductor die in FIG. 4E, illustrating a crack propagation defect.

FIG. 4F is a close up of one side 429 of the semiconductor die 405 in FIG. 4E and shows further details. The mold compound 423 can have filler 451 which is particulate matter that is added to the mold compound to enhance thermal transfer, for example. The polyimide layer 427 is shown over the device side surface 420 of the semiconductor die 405, in the device area 432 where electronic devices (not shown for simplicity of illustration) will be formed in semiconductor die 405. The protective overcoat layer 425 is shown partially covered by the polyimide layer 427 but is not covered in the scribe spacing area 430. In the scribe spacing area 430, which is at the periphery of the semiconductor die 405 between the side 429 and the device area 432 of the semiconductor die 405, the mold compound 423 directly contacts the protective overcoat layer 425. A back-end-of-line metal layer 424 includes metal layers and oxides, the metal can be copper, for example and conductors can be formed in a damascene process using chemical mechanical processes (CMP) to planarize the metal layers. A front-end-of-the line layer 422 can include local interconnect metal and doped polysilicon to form source and drain contacts and to form gate conductors for metal oxide semiconductor field effect transistors (MOSFETs), for example. The front-end-of-the-line layer 422 also includes dielectric material between the metal layers, conductive vias can couple conductors in the metal layers through the dielectric. Semiconductor die 405 is shown with mold compound 423 covering the side 429 and the backside surface 421, which faces away from the device side surface 420.

In FIG. 4F, a scribe seal 453 is shown in block form. The scribe seal 453 can be formed using the back-end-of-the-line layers 424 with vias extending through dielectric between the metal layers to form a vertical metal barrier. The scribe seal can include local interconnect in the front-end-of-the-line layers 422 to extend to the device side surface 420 of the semiconductor die 405. The scribe seal 453 can protect the semiconductor die 405 from cracks and residue that can intrude from the side 429 during wafer dicing operations, for example. One or more scribe seals can be formed at the edges of the semiconductor die, in the scribe spacing area 430 near the side 429. The scribe seal 453 can extend along each edge to form a four-sided seal, when seen from a top view of the device side surface 420 of the semiconductor die 405.

In FIG. 4F, an occurrence of a PO layer crack propagation is illustrated. A crack 460 starts at the interface between the mold compound 423 and the protective overcoat layer 425, and propagates laterally towards the device area 432 at the right side of the figure. This type of crack can occur because the interface between mold compound 423 (or another polymeric material, such as an underfill) and the protective overcoat 425 is not strong, that is the mold compound 423 does not readily adhere to the protective overcoat 425. The various materials have different coefficient of thermal expansion (CTE) values, so that during thermal cycling such as in testing, or in operation, the materials can expand at different rates, and without a stress buffer layer between the materials, the crack 460 may start as shown in FIG. 4F. Once a crack occurs, it may propagate laterally and vertically through the layers, causing a failure.

In the arrangements, polymeric anchors are formed in the device side surface of the semiconductor die in the scribe spacing areas, where the protective overcoat layer (see 425 in FIG. 4F) contacts the mold compound (see 423 in FIG. 4F) or another polymeric material such as an underfill material. In one example method arrangement, a plasma dicing tool is used to simultaneously form the polymeric anchors and to singulate the wafer into the individual semiconductor dies. In an alternative arrangement, the plasma dicing tool can be used in a first etching operation to form the polymeric anchors, and subsequently, to dice the wafer. In a further alternative approach, the polymeric anchors can be formed using a silicon wet etch process, and subsequently, the semiconductor wafer can be diced; either using the plasma dicing tool, or in yet another alternative approach, using a saw or laser dicing tool.

In the arrangements, the polymeric anchors extend through the dielectric layers over the semiconductor die device side surface and into the semiconductor substrate.

When encapsulation operations cover at least a portion of the semiconductor devices with a polymeric material (such as underfill or electronic mold compound), the polymeric material fills the polymeric anchors and creates a strong physical attachment. If a crack begins in the scribe spacing area later on, the polymeric anchors provide a crack stop feature, the propagation of the crack will be interrupted by the polymeric anchors, which extend vertically through the dielectric layers. The crack will not propagate into the device area, preventing a device failure, increasing reliability and reducing failed devices.

FIGS. 5A1-5A4 illustrate, in a series of cross-sectional views, selected steps of a plasma dicing process that can be used to form an arrangement. In FIG. 5A1, at step 571, a portion of a semiconductor wafer 501 is shown with replicated semiconductor dies 5051 and 5052 on either side of a scribe lane 503. Bump metal 516 is shown in block form on a device side surface 520 of the semiconductor dies 5051, 5052.

At step 573 illustrated in FIG. 5A2, the wafer 501 is shown mounted device side down on a backgrind tape or support 560 for a backgrinding operation. The bump metal 516 is temporarily adhered to the backgrinding tape 560. The backside surface 521 is exposed for processing. A backgrinding operation thins the semiconductor wafer 501 in step 573.

At step 575 in illustrated in FIG. 5A3, the wafer 501 is shown mounted backside down to a wafer support frame 562 with the replicated dies 5051, 5052 with bump metal 516 facing upwards. The wafer 501 has been thinned using a mechanical grind or chemical mechanical polishing tool to grind the backside surface 521 in step 573, and then mounted to the wafer support 562, and the backgrind tape 560 has been removed.

At step 575, a photoresist (PR) layer (not visible in FIG. 5A3) can be applied over the semiconductor wafer 501 and patterned to open scribe lane 503 for etching. The semiconductor wafer is then transferred to a plasma etch tool.

At step 577 illustrated in FIG. 5A4, the semiconductor wafer 501 is shown in a plasma chamber 581. The plasma tool can perform various operations depending on the chemistry used and the electric field applied. In an example process, the semiconductor wafer is transferred into a plasma chamber. The plasma chamber is exhausted to form a vacuum. A process gas is introduced at a low pressure. Example process gasses include argon (Ar), oxygen ($O_2$), and fluorine gasses (example, $C_4F_8$, $SF_6$); depending on the process being performed. A plasma is generated by applying a high frequency signal such as a standard 13.56 MHz signal to the gas. Ions from the gas can be accelerated onto the semiconductor wafer in the chamber by applying an electric field between an upper plate and the semiconductor wafer. As the ions bombard the semiconductor wafer, the semiconductor substrate can be etched. In alternative process steps, oxide or nitride etches can be performed, or deposition can be performed, by changing the chemistry of the gasses used.

At step 577 illustrated in FIG. 5A4, in an example, a silicon etch is performed to singulate the semiconductor dies 5051, 5052 by opening the semiconductor wafer 501 in scribe lane 503. In addition, the plasma tool can also perform a photoresist strip step after the etching is complete, an example strip process uses $O_2$ gas in an "ashing" operation.

Plasma dicing of a semiconductor wafer forms a deep vertical cut into and through the semiconductor material. To perform this highly anisotropic etch, a cycle of steps is used.

Figure 5B:
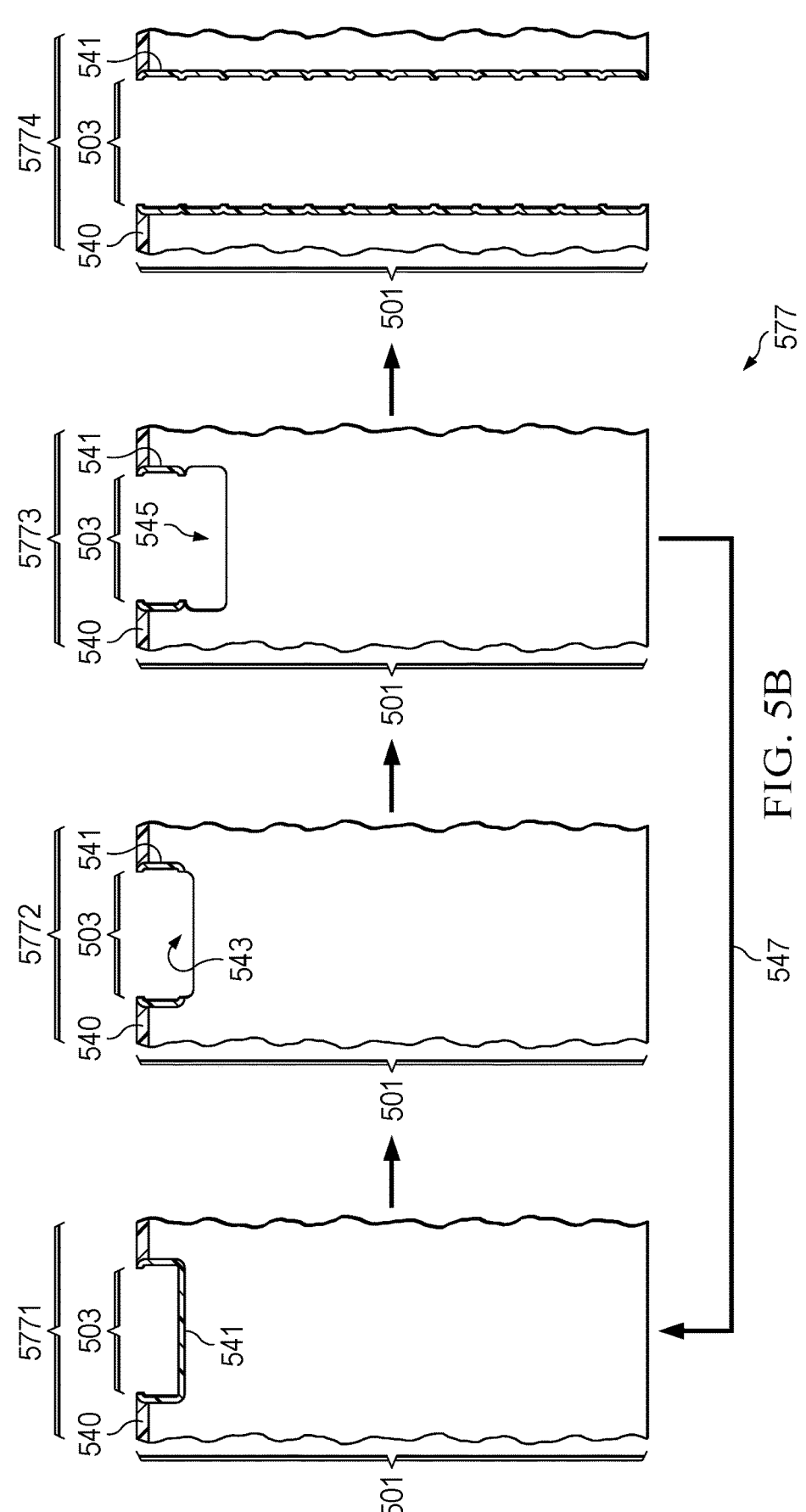
FIG. 5B illustrates a process cycle for a plasma chamber performing plasma dicing on a semiconductor wafer that can be used with the arrangements.

FIG. 5B illustrates, in a series of cross-sectional views, an example plasma dicing process that details the processes used in step 577 in FIG. 5A. A PR layer 540 is shown on the surface of the semiconductor wafer 501, with an opening defining the scribe lane 503. At step 5771, a polymer deposition is performed. This step coats the sidewalls of the previously etched portion of the semiconductor wafer 501 in scribe lane 503 with a polymer coating 541. The polymer coating 541 can be deposited in the plasma tool, using a fluorocarbon polymer, for example.

At step 5772, the plasma dicing cycle continues by performing an etch to remove the polymer coating from the bottom of the scribe lane trench 543, in preparation for the semiconductor etch. The polymer coating remains on the sidewalls of the scribe lane 503, keeping the scribe lane etch a vertical profile as it progresses, making the etch more or less anisotropic.

At step 5773, the semiconductor (for example, silicon) etch process is performed, creating a new trench 545 extending beneath the prior trench 543, and this etch cycle is performed many times. Line 547 shows the cycle, the process returns to step 5771 and continues until the semiconductor wafer is etched through in scribe lane 503. In an example, over 150 cycles were performed to cut through the semiconductor wafer. The number of cycles needed depends on the semiconductor material, the wafer thickness, and the chemistry used. The amount of time for each cycle can be adjusted as well. Because the different etch types require different chemistry and run at different rates, a multi-station plasma tool can be used, with several plasma chambers around a central robot wafer handler that transfers material in and out of the plasma chambers as the method progresses. Because the plasma etch is cyclical and the cyclical process coats the sidewalls with the polymer at each cycle, the vertical sides of the semiconductor dies will have a "scalloped" shape that indicates a plasma semiconductor dicing tool was used.

Once the semiconductor dicing process is complete, the method transitions to step 5774. The individual semiconductor dies are now separate one from another along the scribe lanes (see, for example, scribe lanes 103, 104 in FIG. 1A, with semiconductor dies 105). Advantages of the plasma dicing process over mechanical sawing and laser cutting dicing tools include that the scribe lanes can be smaller in width, increasing the usable semiconductor wafer area and increasing the number of dies per wafer, lowering costs. Chipping and particulate residue problems that occur with mechanical sawing are reduced or eliminated. The heat affected zones created by a laser cutting tool, or by a stealth laser dicing tool, are eliminated, reducing stress on the semiconductor devices. The polymer coating formed during the plasma dicing process can be left on the sides of the devices. A big advantage is that unlike the multiple pass sawing operations, the plasma dicing process cuts all of the scribe lanes on the wafer simultaneously, increasing throughput, and reducing device costs. As already mentioned, the semiconductor wafer area needed for the scribe lanes is reduced, increasing yield.

Figure 5C:
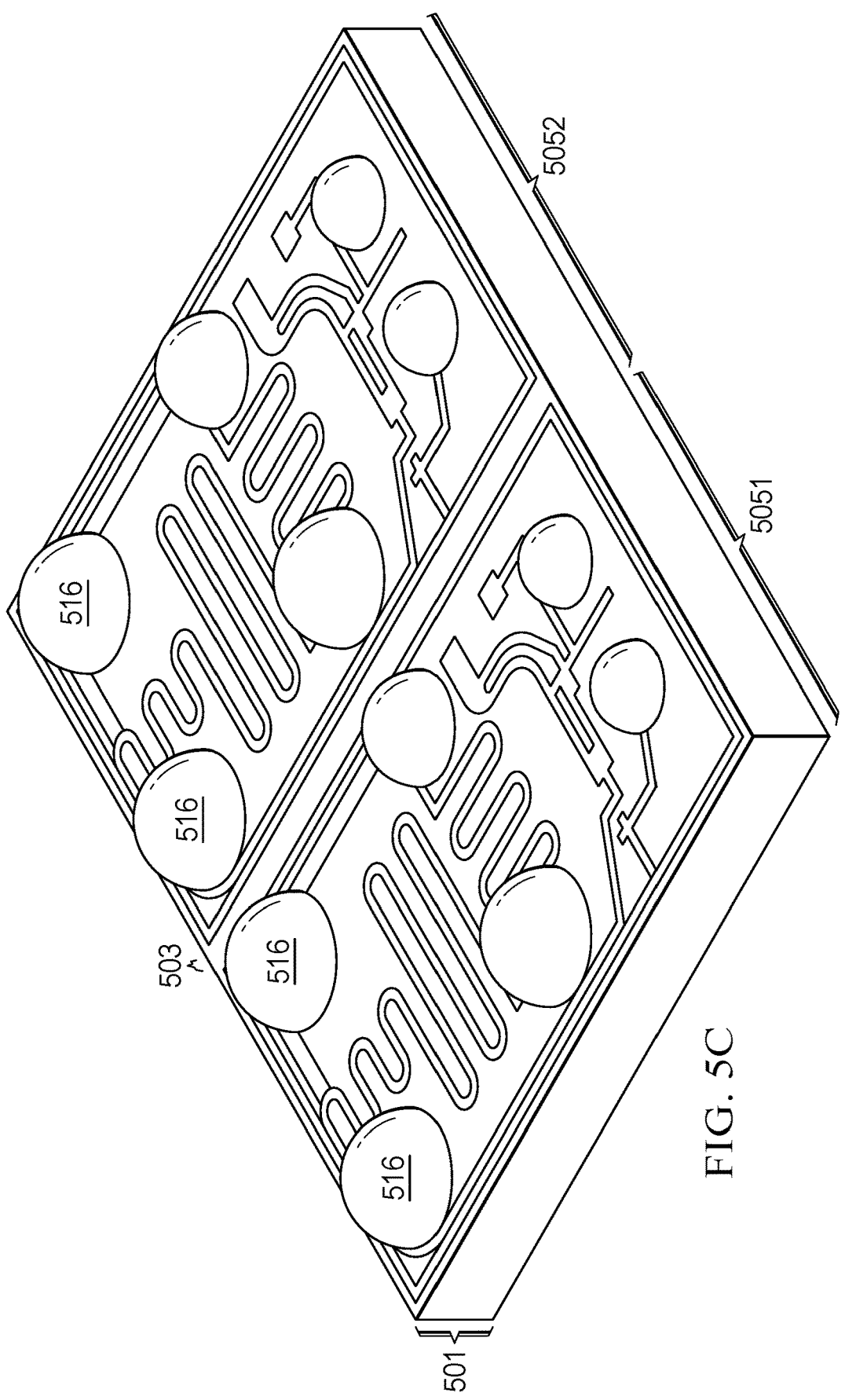
FIG. 5C illustrates, in a projection view, two replicated semiconductor dies with solder bumps and a scribe lane between the semiconductor dies.

FIG. 5C illustrates, as an example, two semiconductor dies 5051 and 5052 on either side of a scribe lane 503, before the semiconductor wafer 501 is diced in a plasma dicing process. The solder bumps 516 are shown on the device side surface of the semiconductor wafer 501.

Figure 5D:
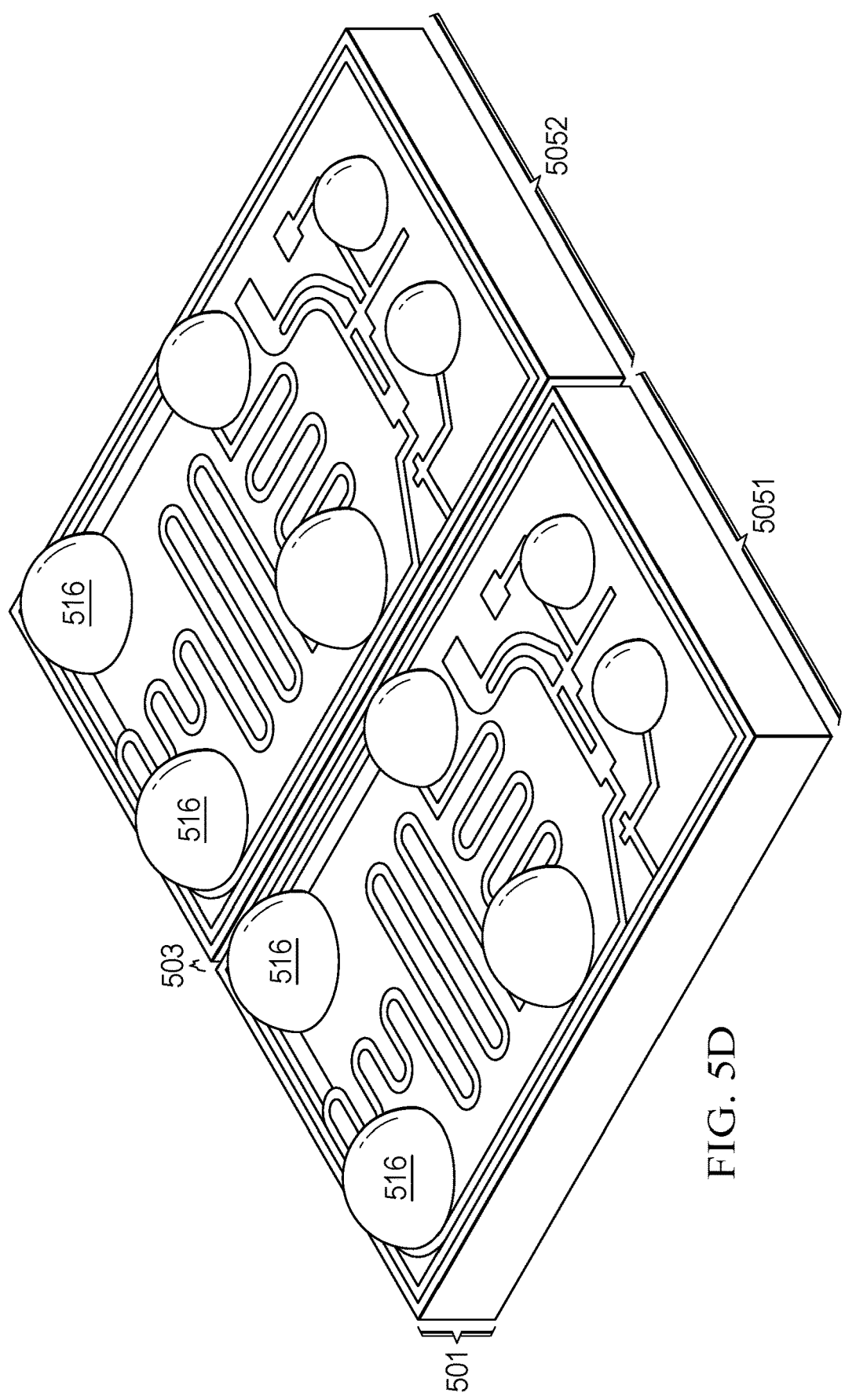
FIG. 5D illustrates in another projection view the replicated semiconductor dies of FIG. 5C, after a dicing operation along the scribe lane.

FIG. 5D illustrates, in a further projection view, the two semiconductor dies 5051, 5052, of FIG. 5C after the plasma dicing process opens the scribe lane 503, singulating the devices from the semiconductor wafer 501. The singulated dies can then be mounted to a package substrate and packaged, see FIGS. 4A-4E, for example.

Figure 5E:
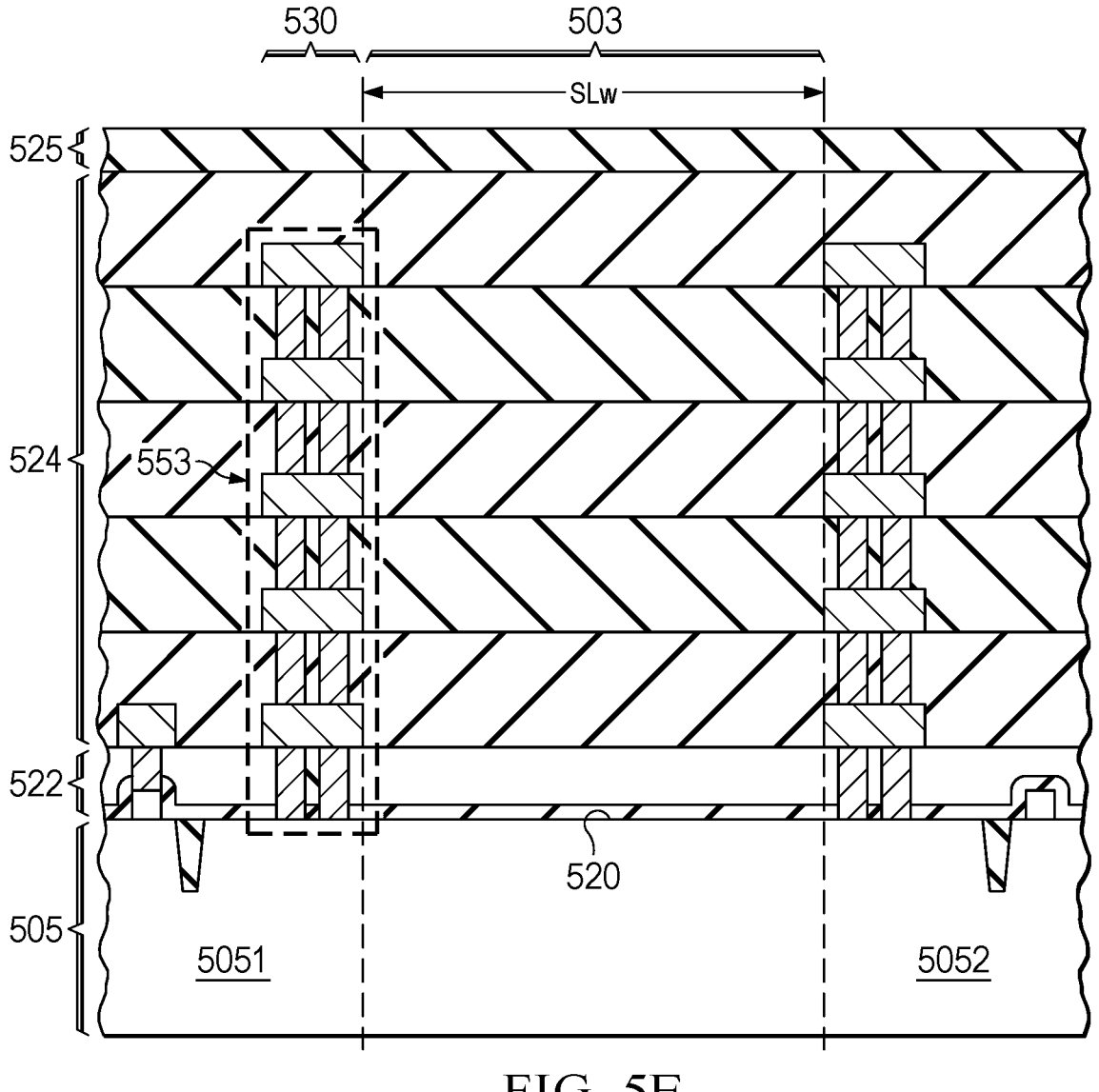
FIG. 5E illustrates, in a cross-sectional view, details of a scribe lane between two semiconductor dies, and a scribe spacing area.

FIG. 5E illustrates, in a close up, cross-sectional view, additional details of the scribe lane 503, such as in FIG. 5C. Semiconductor dies 5051, 5052 are replicated units that are joined, prior to dicing, by the semiconductor wafer in the scribe lane 503 that extends between the devices. The scribe lane 503 is designed to be free of metal structures, to enable the dicing operations to be performed without the need to cut through any metal. The scribe lane 503 is covered with the protective overcoat 525, which can be an inorganic dielectric layer such as SiN, SiON, SiC, or a similar material. However, even though portions of the device side surfaces of the semiconductor dies 5051, 5052 may have a polyimide layer over the dielectrics, the scribe lane 503 does not have the polyimide layer, again this enhances the dicing process.

In FIG. 5E, scribe seals 553 are shown extending through the front end of the line layer 524, and the back end of the line layer 522, to the device side surface 520 of the semiconductor dies 5051, 5052. The scribe seal 553 is at the edge of the scribe spacing area 530 adjacent the scribe lane 503. The scribe seals 553 can be formed of the back-end-of-the-line metal layers, with vias extending between the metal layers to form a vertical stack through the back end of the line layer 524, and contacts extending through the front end of the line layer 522 to the device side surface 520. The scribe seals 553 are helpful in preventing cracks from the sides formed in dicing the wafer 501 from propagating into the semiconductor dies 5051, 5052. However, the scribe seals lie beneath the protective overcoat 525, and do not prevent cracks starting at the polymeric material interface to the protective overcoat 525 from propagating (see FIG. 4F). The scribe lane 503 has a minimum width of about 8 microns, and in an example process, a 10-micron width was used. This width labeled "SLw" in FIG. 5E is much less than the minimum scribe lane widths of 60-80 microns used for a saw dicing operation, and a similar width used for a laser cutting dicing operation. Reducing the scribe lane width SLw increases the wafer area available for devices, reducing unit costs and increasing yields.

In the arrangements, polymeric anchors are formed in scribe spacing areas between the edges of the semiconductor die and the device area. The polymeric anchors are formed in the scribe spacing areas where, in a semiconductor device package, the polymeric material (such as EMC or underfill material) directly contacts a protective overcoat dielectric layer. The polymeric anchors are recesses that extend through the protective overcoat layer and through additional dielectric layers over a device side surface of the semiconductor die, and into the semiconductor substrate. When an encapsulation process covers the semiconductor die with polymeric material to form a semiconductor device package, the polymeric fills the polymeric anchors, creating a strong attachment between the polymeric material and the semiconductor die. The vertical filled polymeric anchors prevent cracks from propagating from the scribe spacer areas to the device areas of the semiconductor dies.

Figure 6A:
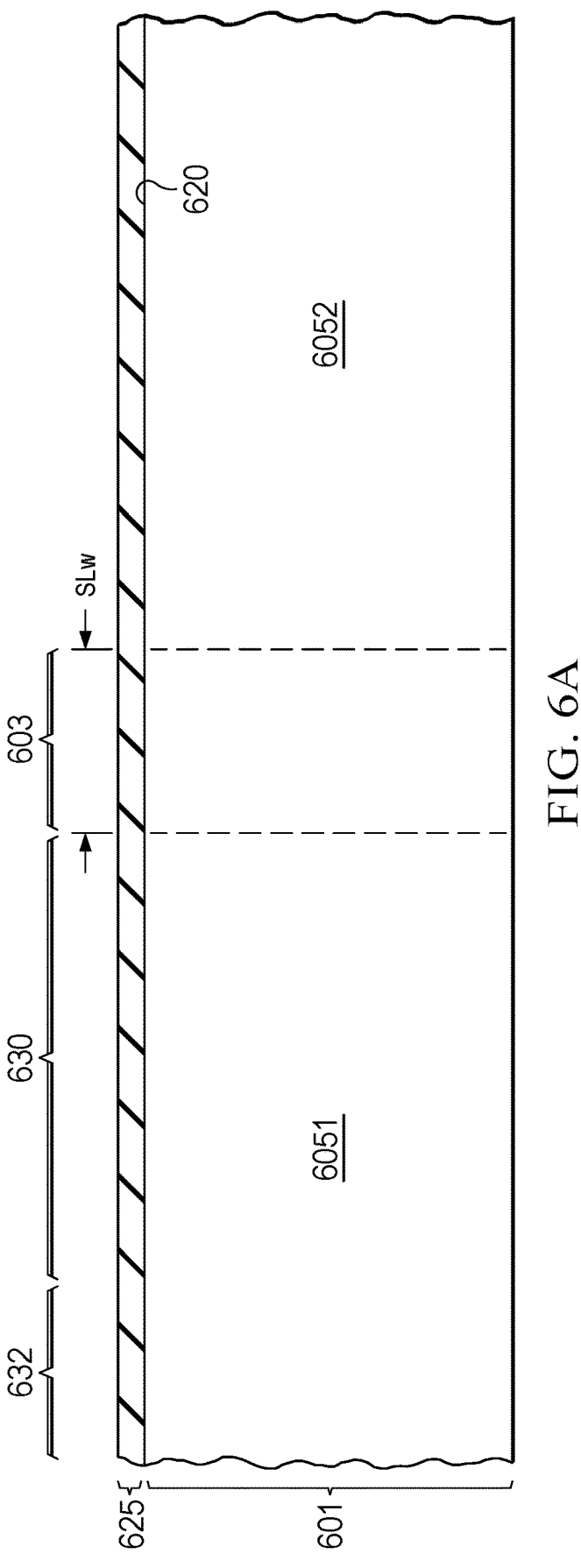
FIGS. 6A-6F illustrate, in a series of cross-sectional views, selected process steps for forming an arrangement.

FIGS. 6A-6F illustrate, in a series of cross-sectional views, selected steps for forming a semiconductor device including the polymeric anchors in an example arrangement. In FIG. 6A, an example semiconductor wafer 601 is shown with a scribe lane 603, and portions of replicated semiconductor dies 6051, 6052 are shown on either side of the scribe lane 603. The scribe lane 603 has a width "SLw" that can be about 8 microns or more, in an example 10 microns was used. A protective overcoat layer 625, similar to PO layer 525 in FIG. 5E, for example, is shown. Scribe seals may be present in the scribe spacing area 630 but are not shown for simplicity of illustration. (See scribe seals 553 in FIG. 5E, for example.)

Semiconductor wafer 601 can be any material used in semiconductor processing, most semiconductor wafers currently manufactured are silicon. Germanium, gallium arsenide, silicon carbide, indium phosphide and other semiconductor materials can be used for wafer 601.

The protective overcoat layer 625 is formed on a device side surface 620 of the semiconductor wafer 601, however, additional layers such as front-end-of-the-line layers including local interconnect conductors and contacts to the semiconductor substrate, and back-end-of-the-line layers such as multi-level metal conductors spaced from one another by dielectrics and connected by conductive vias, are not shown for simplicity of illustration. (See, for example, layers 522, 524 in FIG. 5E). The protective overcoat layer 625 lies over any of these metal layers.

Figure 6B:
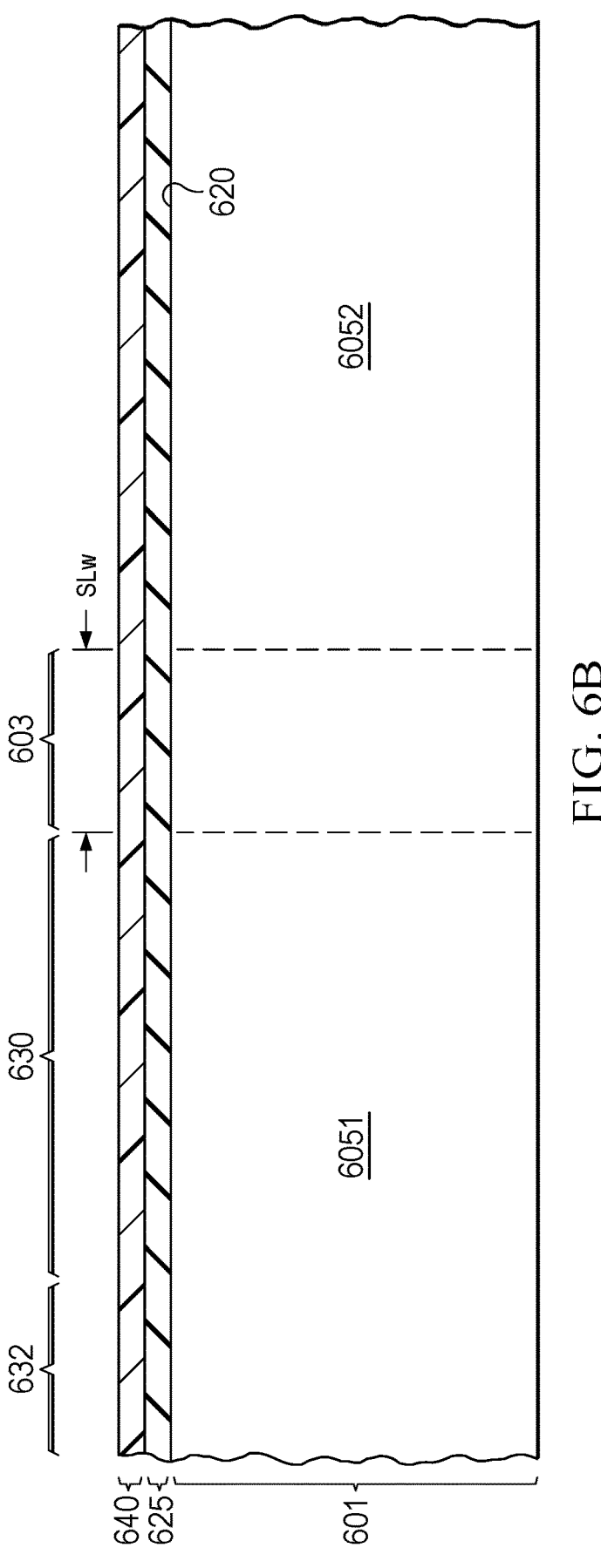

FIG. 6B illustrates, in another cross-sectional view, the elements of FIG. 6A after a photoresist layer deposit is performed. The photoresist layer 640 is over the protective overcoat layer 625 and will protect areas that are not to be etched. The photoresist (PR) layer 640 can be a liquid or gel that is deposited and spin coated and then baked to harden the PR layer, for example. The example scribe lane 603 has a width SLw of about 10 microns, or less, although wider scribe lanes can be used. As described above, the narrow scribe lanes that can be used with plasma dicing tools increase the semiconductor wafer area where devices can be formed.

Figure 6C:
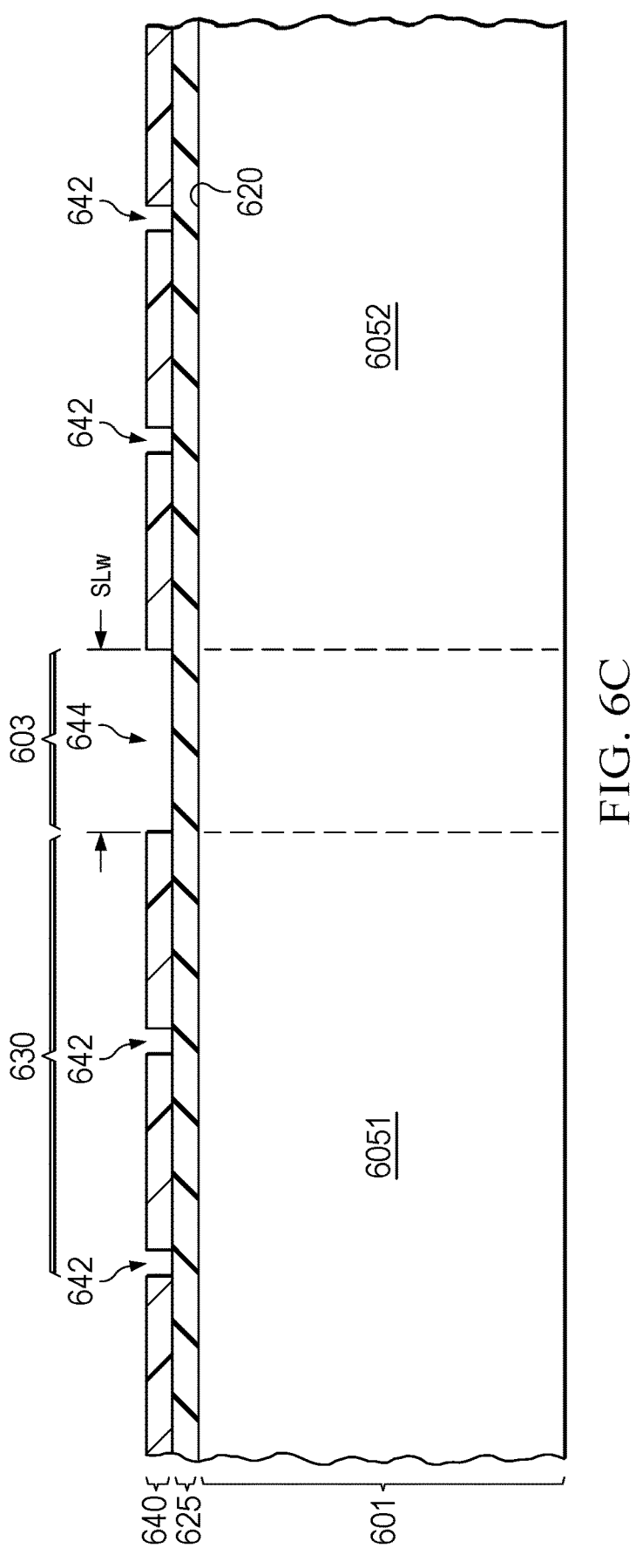

FIG. 6C illustrates, in another cross-sectional view, the elements of FIG. 6B after the photoresist layer 640 is patterned. Openings 642 are formed in the scribe spacing area 630 that extends from the boundary of the scribe land 603. A scribe lane opening 644 is formed in the PR layer 640 corresponding to the location of scribe lane 603. The PR can be patterned using photolithography, a mask is applied, the PR is exposed through the mask, and the PR is developed to form the patterns with openings in areas that are to be etched.

Figure 6D:
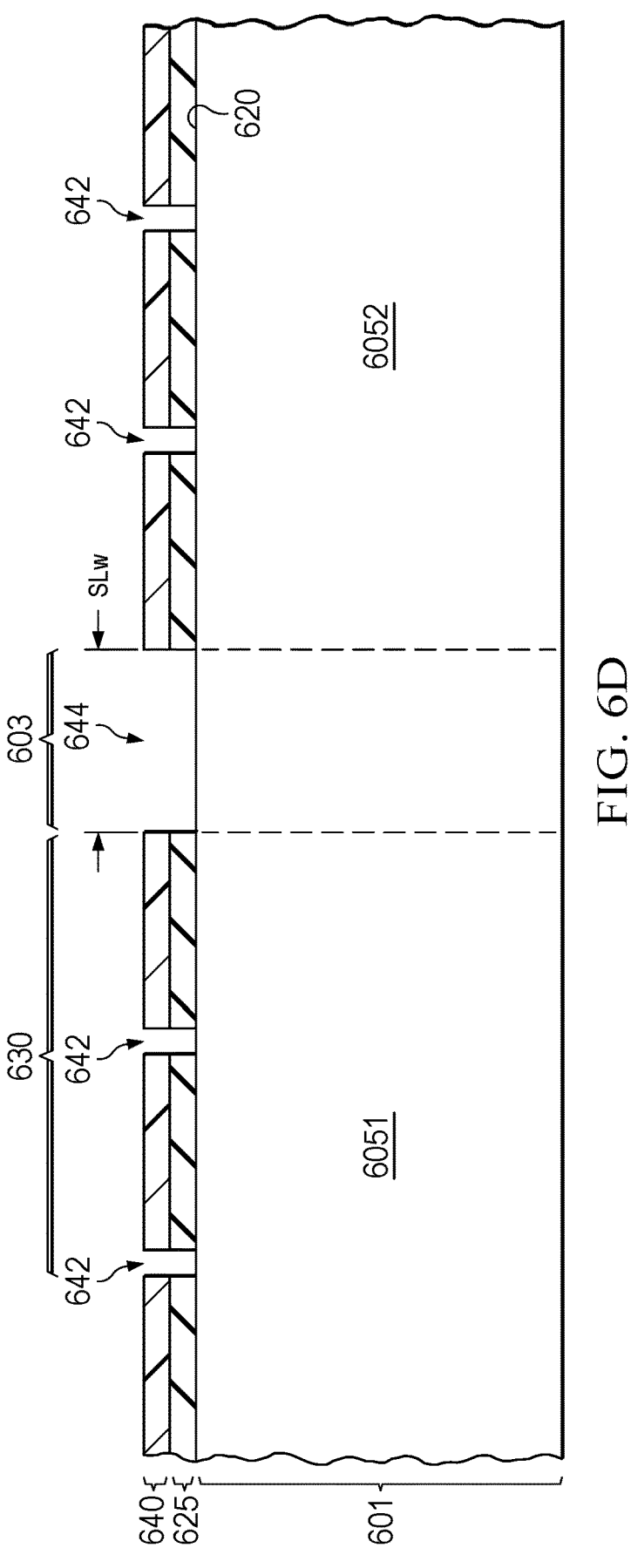

FIG. 6D illustrates, in another cross-sectional view, the elements of FIG. 6C after additional processing. In FIG. 6D, the protective overcoat layer 625 is shown after a dielectric etch. In an example process, a plasma etching tool is used to perform an oxide etch. In an example plasma etching process, a process gas of Ar, $C_4F_8$, and $O_2$ is used to in the plasma tool to etch the protective overcoat from the semiconductor devices in the openings in PR layer 640. Any dielectric materials underlying the PO layer 625 are also etched to expose the semiconductor wafer 601 in the openings.

Figure 6E:
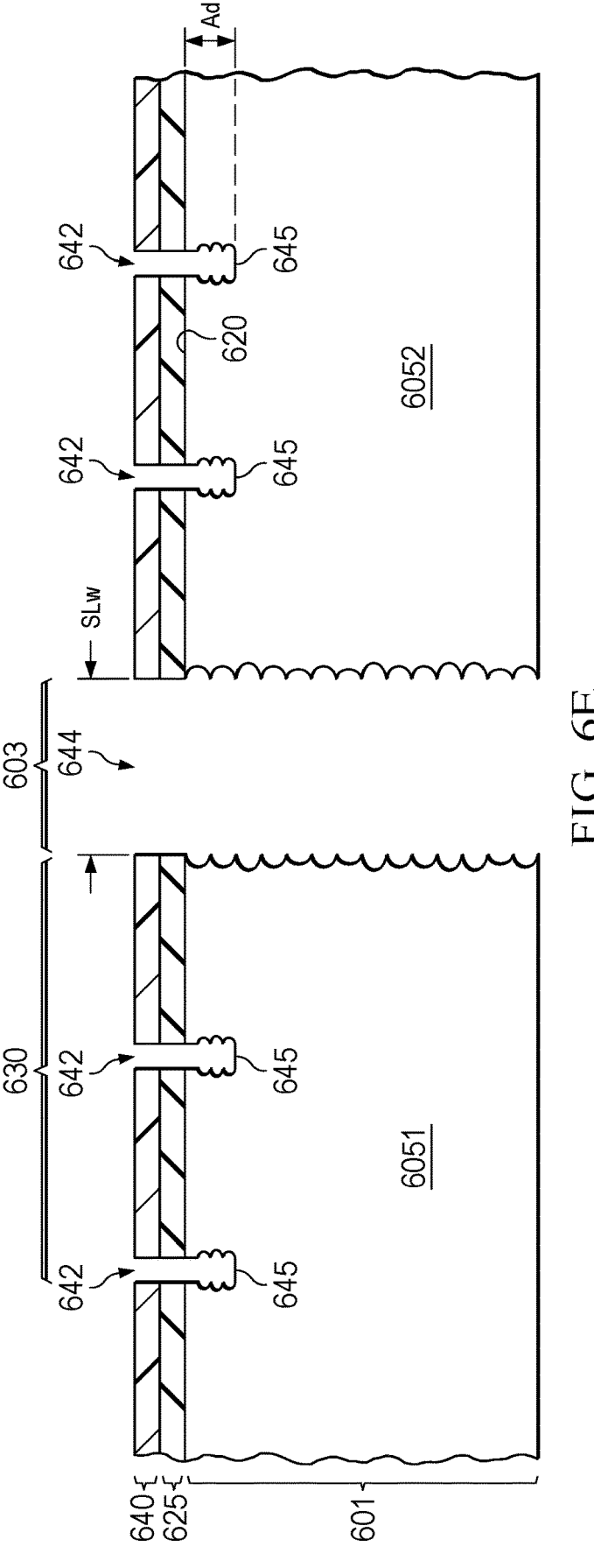

FIG. 6E illustrates, in yet another cross-sectional view, the elements of FIG. 6D after an additional process step, a semiconductor etch. The semiconductor wafer 601, which in an example is silicon, can be etched using a plasma tool and a process gas of $C_4F_8$, and $SF_6$. As shown in FIG. 5B at steps 5771, 5772, and 5773, in an example plasma silicon etch, a polymer deposition step is performed, a punch through etch is performed to open the bottom of the prior recess, and a silicon etch is performed, the cycle repeats to coat the sidewalls with polymer between silicon etch cycles, until the semiconductor wafer 601 is etched through in the scribe lane 603. In the arrangements, polymeric anchors 645 are formed in the surface of the semiconductor wafer 601 in the scribe spacing area 630. The polymeric anchors 645 are placed spaced from any scribe seals, so as not to etch through the metal of the scribe seals. The polymeric anchors 645 are recesses, cavities or trenches extending through the protective overcoat layer 640 and any underlying dielectric layers, and into the device side surface 620 of the semiconductor wafer 601. In an example, the polymeric anchors can be cavities with a round shape when seen from a top view. The polymeric anchors 645 have a depth labeled "Ad" that is determined by the width of the openings 642, as the openings get wider, the depth increases, and vice versa. By controlling this depth Ad, the polymeric anchors 645 can be positioned and sized as desired. In an example process, the anchor depth Ad was about 50 microns, with an anchor diameter of between 10 microns and 50 microns. The anchor depth Ad can vary from about 20 to about 200 microns, depending on the semiconductor die thickness and the PR pattern openings used, as well as the plasma etch process used. The plasma dicing tool form scallops on the sidewalls of the polymeric anchors and the sides of the dies, the scallops can be between 3-6 microns in height and width in an example plasma etch process. The scribe lane width SLw can be a width greater than about 8 microns, and in one example process a width SLw of about 10 microns is used, a width that is much less than the minimum widths required by other dicing processes such as a saw, or a laser cutting tool. When the polymeric anchors 645 are formed in the plasma etching cycle, the sides will have scalloped sidewalls formed by the repeated plasma etching process, as shown in FIG. 6E.

The polymeric anchors 645 can be placed anywhere in the scribe spacing area 630. In one approach, experimental data from failed parts or mechanical simulation results are used to determine the most likely areas on the device side surface of the semiconductor die for PO layer cracks to occur. Typically, areas that have the greatest distance from the neutral point ("DNP"), which are usually near the semiconductor die corners, are most likely to benefit from the use of the polymeric anchors. Accordingly, in one approach, the polymeric anchors are placed in the scribe spacing area at the periphery of the semiconductor die around the die corners. In another example approach, the polymeric anchors can be placed around the entire periphery of the die, between the scribe seals at the die edges, and the device area.

Figure 6F:
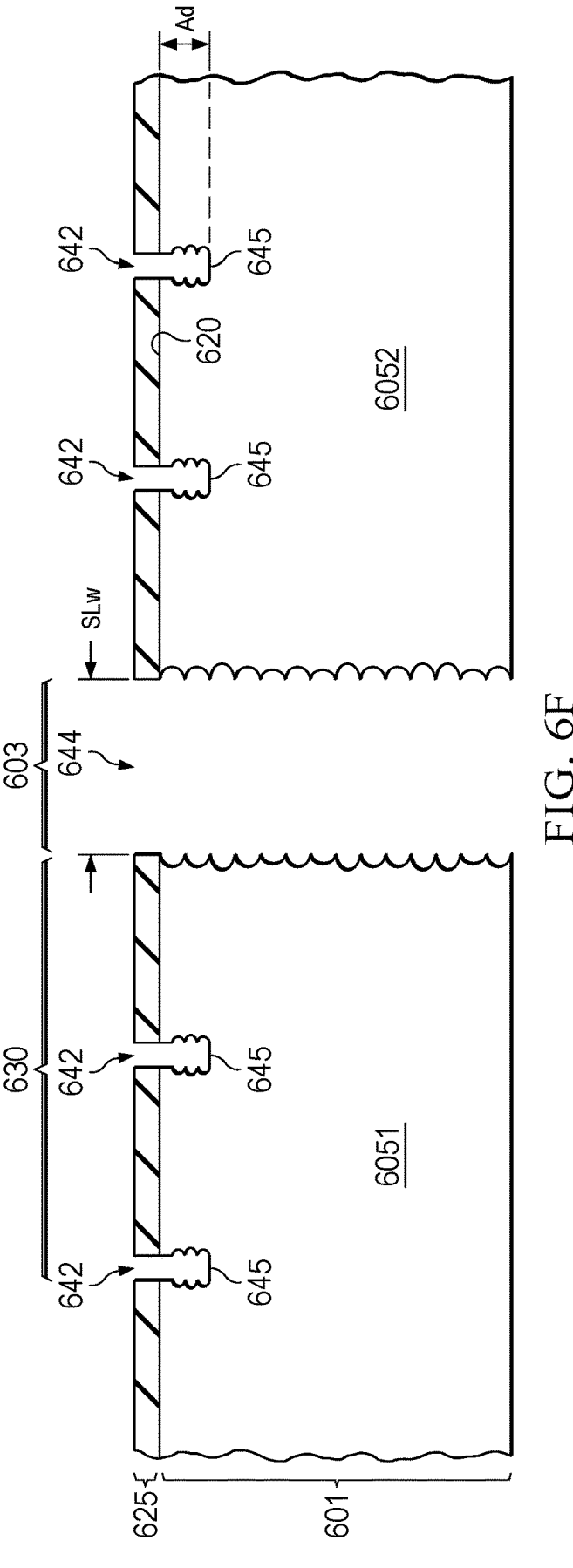

FIG. 6F illustrates the elements of FIG. 6E after a PR strip step removes the PR layer 640 from the protective overcoat layer 625. The polymeric anchors 645 are shown open at the top surface of the protective overcoat layer 625, and are recesses or cavities that extend into the semiconductor substrate 601. In this example arrangement, the plasma silicon dicing process, performed in a plasma etch tool, is used to simultaneously form the polymeric anchors 645, and to etch through the semiconductor wafer 601 in scribe lane 603, using a single PR masking process. This approach advantageously forms the polymeric anchors 645 along with the dicing process, saving time and additional process steps. As further described below, however, in alternative approaches, the polymeric anchors 645 can be formed prior to the semiconductor wafer dicing step. When the polymeric anchors 645 are formed in a semiconductor wafer dicing step using the cyclical approach of FIG. 5B, the sides of the polymeric anchors 645 will be scallop shaped as shown in FIG. 6E.

In FIG. 6F, the two semiconductor dies 6051, 6052 are now singulated from the semiconductor wafer 601. Each semiconductor die 6051, 6052 includes polymeric anchors 645 in the scribe spacing area 630. The scribe spacing area 630 can also include scribe seals (see, for example scribe seal 553 in FIG. 5E) and in those example arrangements, the polymeric anchors 645 will be spaced from the scribe seals to avoid etching through the scribe seal metals.

Figure 6G:
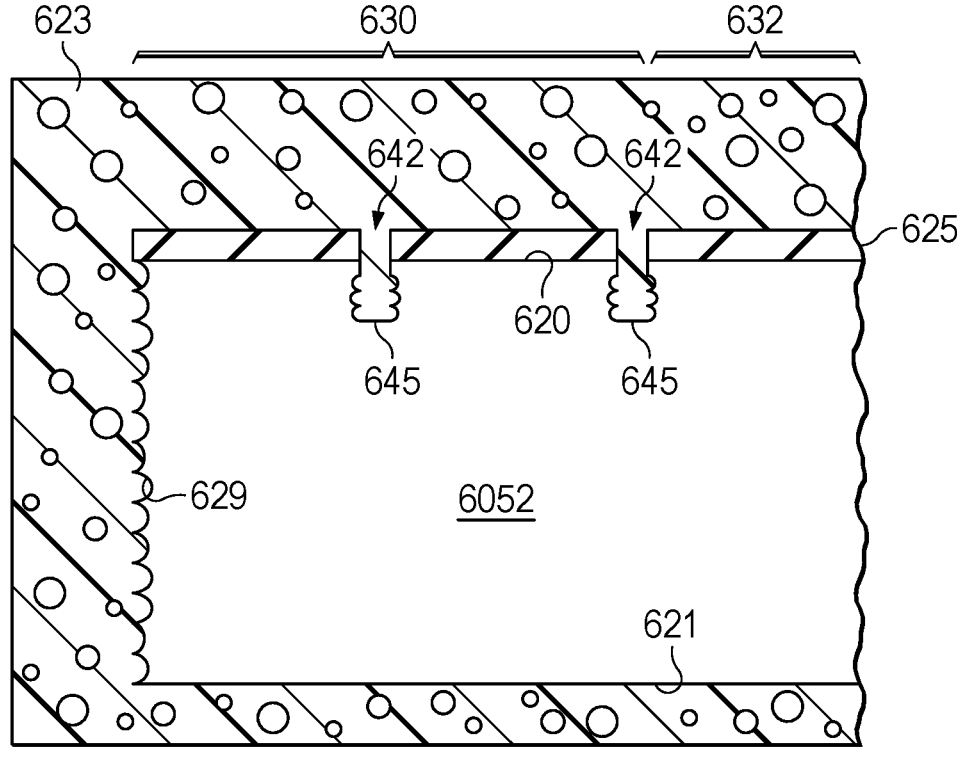

FIG. 6G illustrates the semiconductor die 6052 of FIG. 6F after the die is covered in a polymeric material such as a mold compound 623 in a packaging process (see, for example, FIGS. 4A-4F). In an alternative package type, the device side surface 620 can be covered with an underfill material (see the FCBGA package 309 in FIG. 3B with underfill material 319, for example). The semiconductor die 6052 has a die edge 629 formed by the plasma silicon etching process, and polymeric anchors 645 are shown in the scribe spacing area 630. The semiconductor die in FIG. 6G is shown in a partial view, the semiconductor die 6052 has a device side surface 620, a board side surface 621, and four sides, a first, second, third and fourth side, that extend between the board side and the device side. The side 629 is one of the four sides. The polymeric anchors 645 will be filled with the polymeric material, here mold compound 623, increasing the strength of the attachment between the mold compound 623 and the PO layer 625, and the filled polymeric anchors 645 will also act as crack propagation stops, so that if a crack begins in the polymeric material such as mold compound 623, or at the interface between the mold compound 623 and the PO layer 625, the crack will not propagate from the scribe spacing area 630 into the device area 632 of the semiconductor die 6052.

Figure 6H:
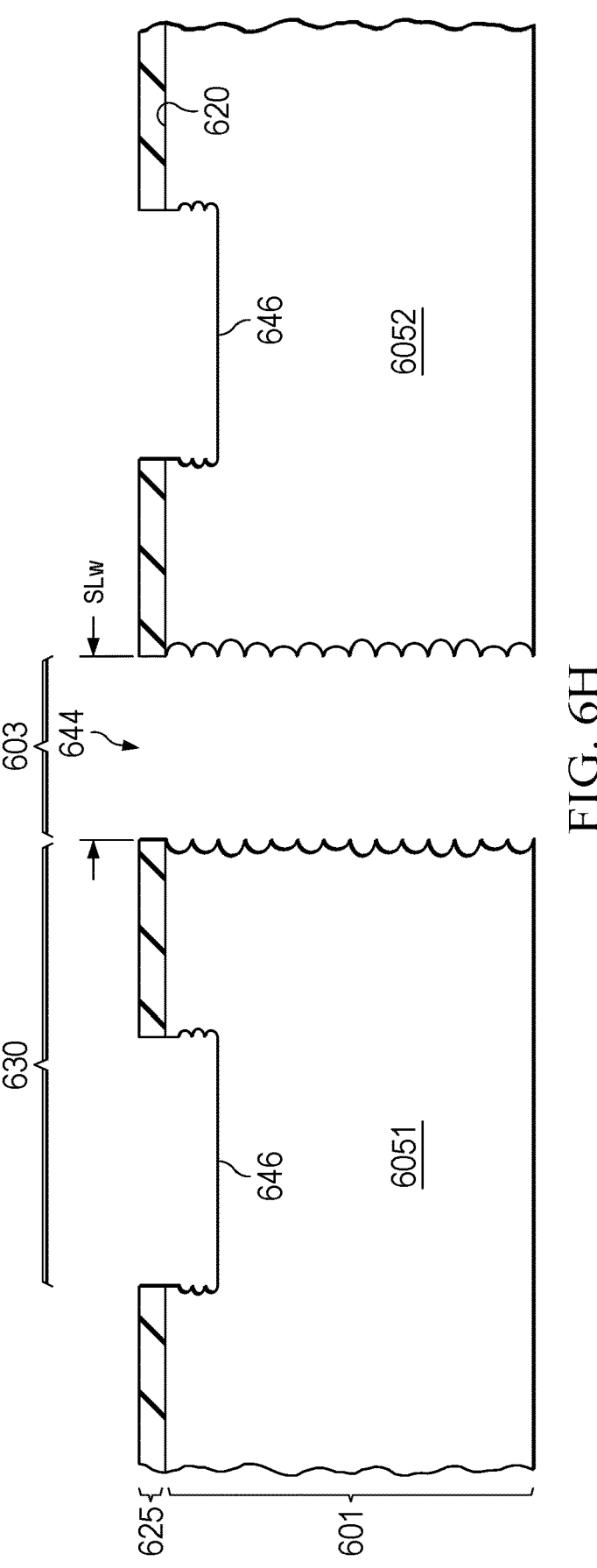
FIG. 6H illustrates, in a cross-sectional view, a semiconductor wafer with an alternative arrangement.

FIG. 6H illustrates, in another cross-sectional view, an alternative polymeric anchor pattern that can be formed in the plasma dicing tool while the semiconductor wafer is being diced. In FIG. 6H, scribe lane 603 is shown disposed between two semiconductor dies 6051, 6052, with a scribe spacing area 630 starting at the boundary of the scribe lane 603 at the edge of each semiconductor die. Polymeric anchors 646 are patterned as open trenches extending through the protective overcoat layer 625 and into the device side surface 620 of the semiconductor wafer 601. In this arrangement the polymeric anchors 646 have a horizontal length parallel to the device side surface of the semiconductor die 6051 that is greater than the anchor depth into the surface of the semiconductor die. When the semiconductor dies 6051, 6052 are covered in a polymeric material such as a mold compound or an underfill in a subsequent packaging process, the polymeric material will contact the semiconductor wafer 601 in the polymeric anchors 646, reducing the contact with the protective overcoat layer 625. Since the adhesion of the polymeric material to the semiconductor wafer is better than the adhesion to the protective overcoat layer 625, the likelihood of cracks forming in the protective overcoat layer 625 and propagating into the device area of the semiconductor devices is reduced or eliminated. In mechanical simulations using the arrangement of FIG. 6H, when a crack was observed occurring in an example using mold compound, the crack stayed within the mold compound and did not propagate into the other materials. These simulations show that by use of the arrangements, the cracks did not reach the device area of the semiconductor device and instead remained in the mold compound.

FIGS. 7A-7G illustrate, in a series of cross-sectional views, selected steps for forming alternative arrangements with polymeric anchors of various shapes formed using plasma dicing, plasma etching, or alternatively, wet or chemical etching processes.

Figure 7A:
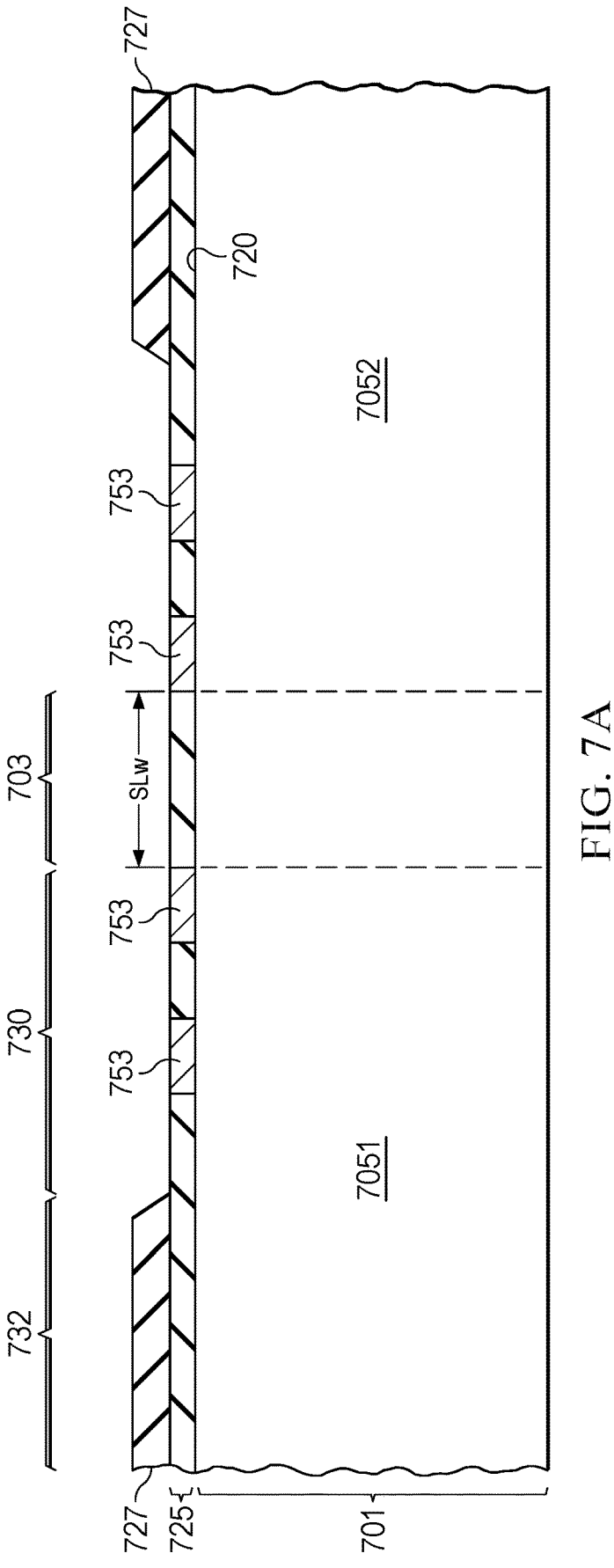
FIGS. 7A-7H illustrate, in another series of cross-sectional views, selected steps for forming alternative arrangements.

FIG. 7A illustrates in a cross-sectional view, a portion of a semiconductor wafer 701, with replicated semiconductor dies 7051, 7052 on either side of a scribe lane 703. In FIG. 7A, the semiconductor wafer 701 has a device side surface 720 covered by a protective overcoat layer 725, which can be an inorganic dielectric, for example a silicon nitride, silicon oxide, or silicon carbide. In device area 732 the protective overcoat layer 725 can be covered by a polyimide layer 727, while in scribe spacing areas 730 between the device areas 732 and the scribe lane 703, the protective overcoat layer 725 is not covered by the polyimide layer 727. As described above, when the semiconductor dies 7051, 7052 are packaged in a semiconductor device package (see FIGS. 4A-4F), a polymeric material such as mold compound or an underfill material will directly contact the protective overcoat layer 725, and adhesion problems and cracking defects occur in this area of the packaged semiconductor device.

In FIG. 7A, the scribe spacing area 730 includes scribe seals 753 at the edge of the semiconductor dies 7051 where the scribe lane 703 meets the scribe spacing area 730. In addition, a second scribe seal may be used inset from the edge scribe seal as shown. In the arrangements, the polymeric anchors will be formed spaced from the scribe seals, because the scribe seals include metal structures (see the detailed view of an example scribe seal 553 in FIG. 5E and the corresponding description above). To prevent damage by the etch processes used to form the polymeric anchors, the polymeric anchors will be formed spaced from the scribe seals.

Figure 7B:
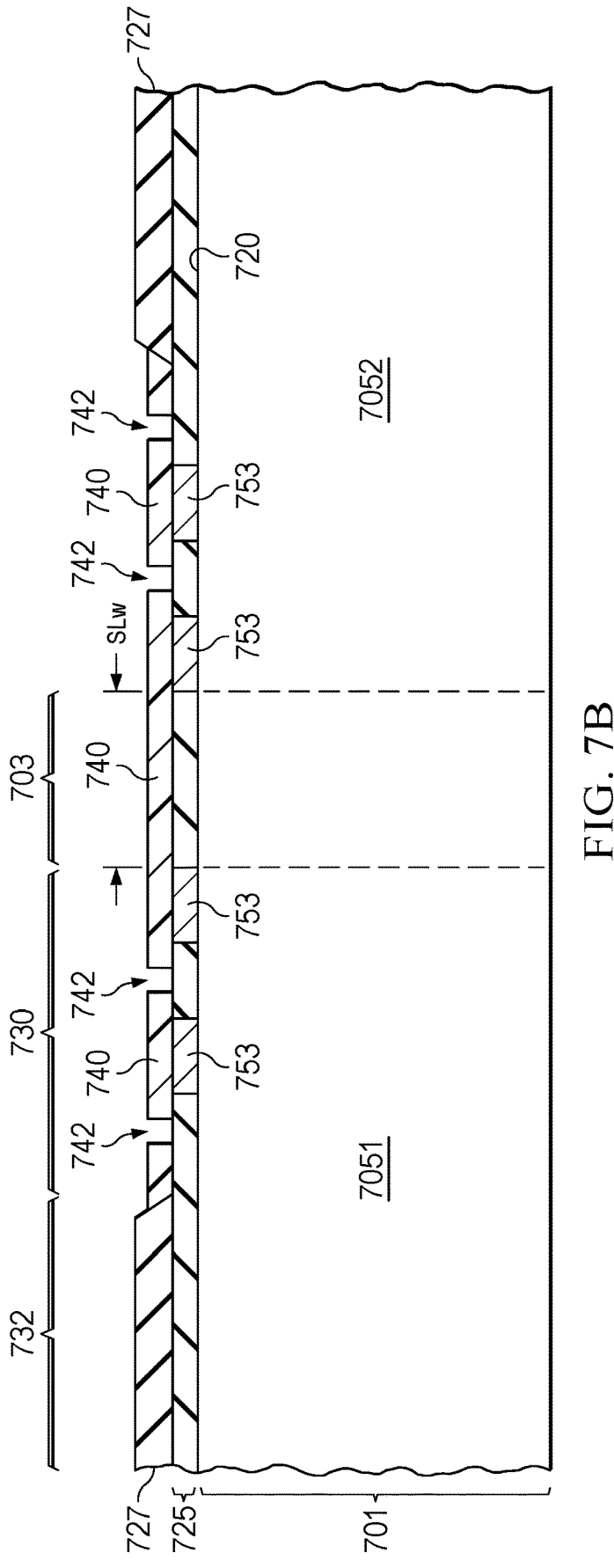

FIG. 7B illustrates, in another cross-sectional view, the elements of FIG. 7A after a photoresist deposition and patterning process. As shown in FIG. 7B, photoresist 740 is deposited and patterned to form openings 742 spaced from the scribe seals 753, for example if two scribe seals are used on the semiconductor dies 7051, 7052, the openings are placed between them and inset from them, in this example, although other patterns can be used. In contrast to the arrangements of FIGS. 6A-6H, in this alternative approach, the scribe lane 703 is left covered at this step; in this alternative approach the polymeric anchors will be formed prior to the dicing process; this allows for different shapes and different etch profiles to be used, the etches for the polymeric anchors are not the same as the etch used for dicing.

Figure 7C:
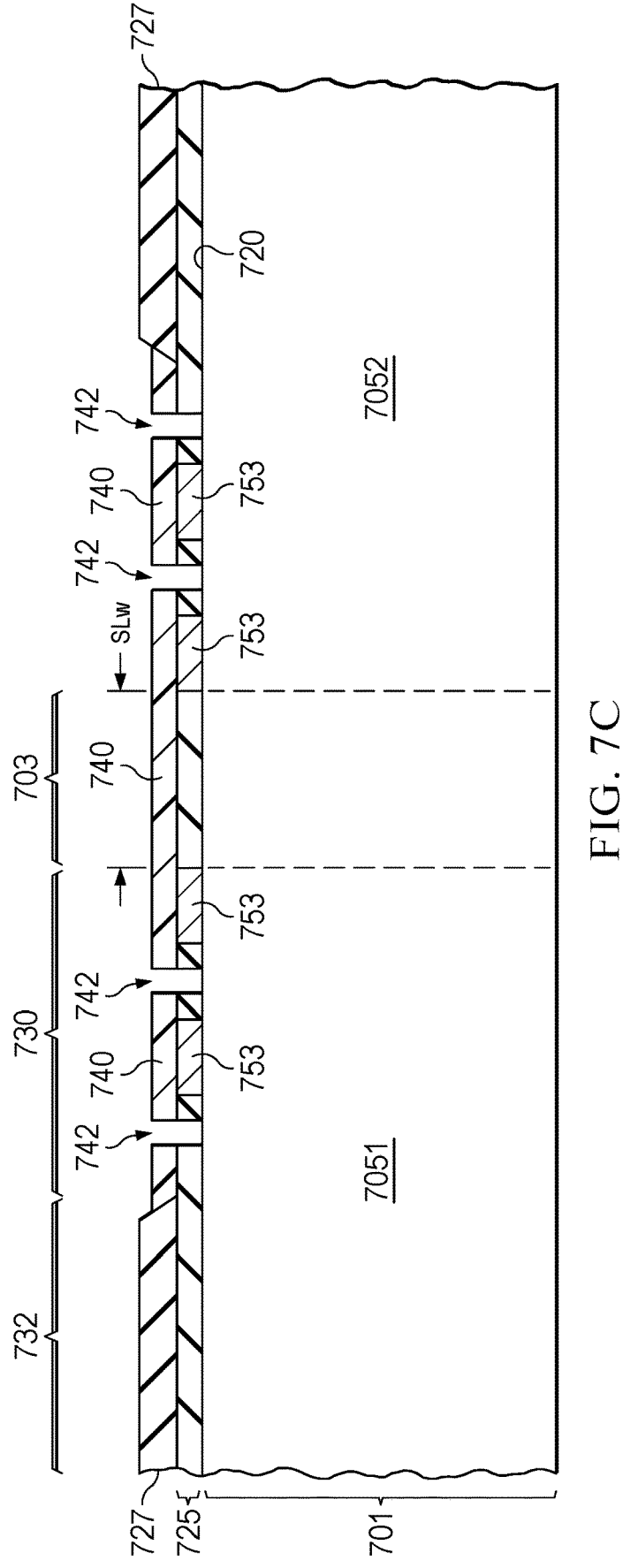

FIG. 7C illustrates in another cross-sectional view the elements of FIG. 7B after an additional process step. In FIG. 7C, the protective overcoat 725, and any other underlying dielectric layers (not shown for simplicity of illustration, see the description of the front end of the line layer and the back end of the line layer and the details illustrated in FIG. 5E, described above) are etched through to the device side surface 720 of the semiconductor wafer 701 in the openings 742. The dielectric etch can be performed in a plasma dicing tool as a nitride or oxide etch. In an alternative approach, wet etches for oxides and nitrides can be used to etch the dielectric layers in the openings 742.

Figure 7D:
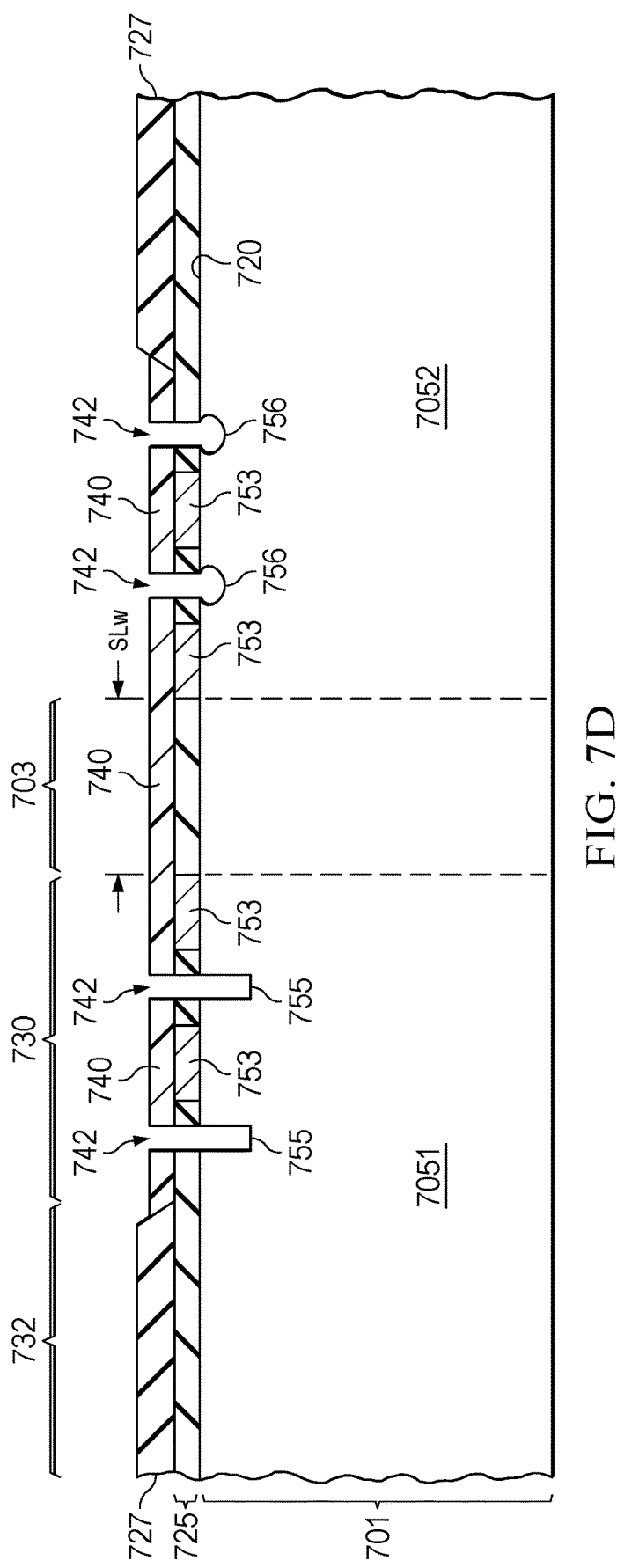

FIG. 7D illustrates, in a further cross-sectional view, the elements of FIG. 7C after an additional etch process. In FIG. 7D, polymeric anchors 755 and 756 are shown. The example polymeric anchors 755 are rectangular in cross section, while the example polymeric anchors 756 are circular or oval in cross section. Additional polymeric anchor shapes can be formed as additional alternatives, such as the trench openings shown in FIG. 6H. In an example process, a plasma etching tool (a dry etch process such as a deep reactive-ion etching (DRIE) plasma process) can be used to perform a semiconductor etch on the semiconductor wafer 701 in the openings 742 to form the polymeric anchors 755 or 756. For example, a plasma dicing tool can be used. In additional alternatives, wet etching such as a silicon wet etch process can be used to form the polymeric anchors 755 or 756. Depending on whether the etch process selected used is more anisotropic or more isotropic, different polymeric anchor shapes can be formed. In contrast to the approach of FIGS. 6A-6H, the etch process in this approach for forming the polymeric anchors does not etch the semiconductor wafer 701 in the scribe lane 703, which at this stage remains covered by PR 740.

With respect to where the polymeric anchors 755 or 756 should be placed, as described above, using experimental data collected on failed devices or using mechanical simulators, areas in scribe spacing areas of semiconductor dies where cracking in the protective overcoat, or at the interface between the protective overcoat and the polymeric material, are most likely to occur can be identified. Observations indicate that the corner regions of the semiconductor die, where the distance to the neutral point (DNP) at the center of the semiconductor die is greatest, are the places where the cracking problems are most likely to occur. The polymeric anchors can be placed at the corner regions and reduce or eliminate the likelihood a crack will propagate into the device area of the semiconductor device. Alternatively, the polymeric anchors can be placed throughout the scribe spacing area around the semiconductor die.

Figure 7E:
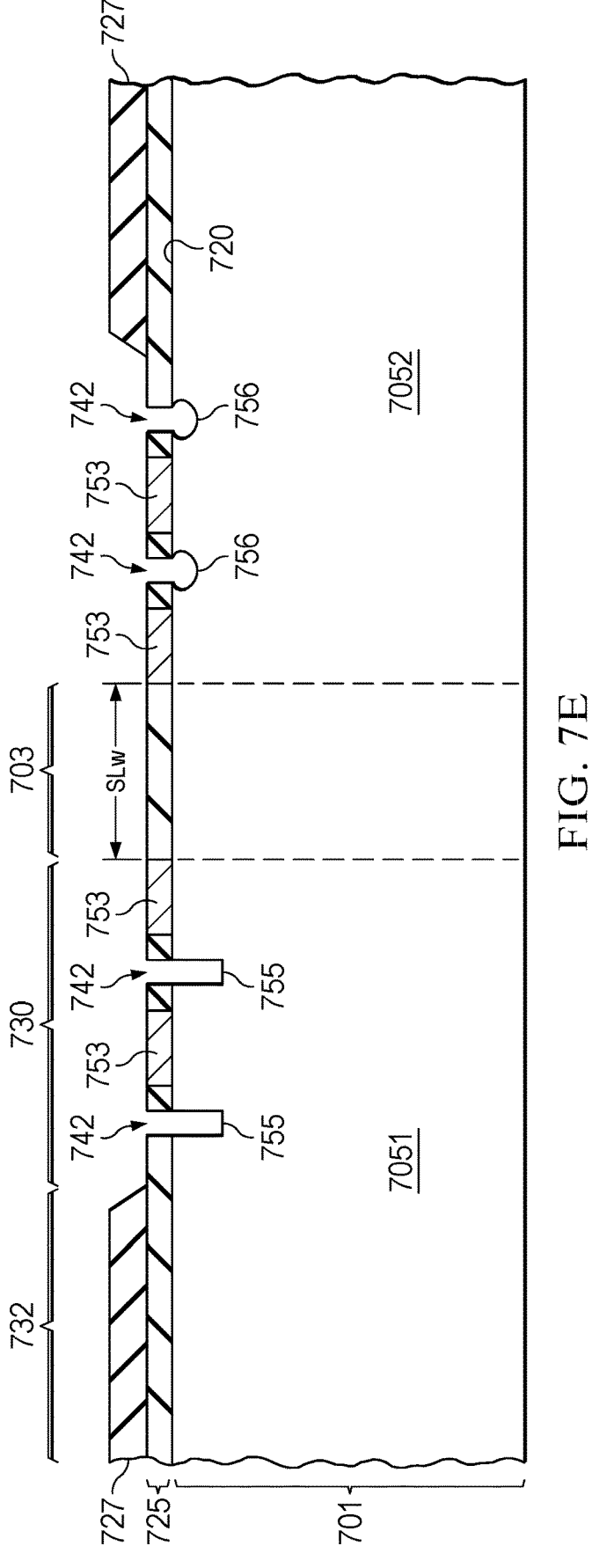

FIG. 7E illustrates, in another cross-sectional view, the elements of FIG. 7D after additional processing. In FIG. 7E, the photoresist layer 740 is removed from the semiconductor wafer 701. In one example process, a plasma ashing process is used to strip the photoresist layer 740. In alternative processes, chemical strippers can be used to remove the photoresist layer 740.

Figure 7F:
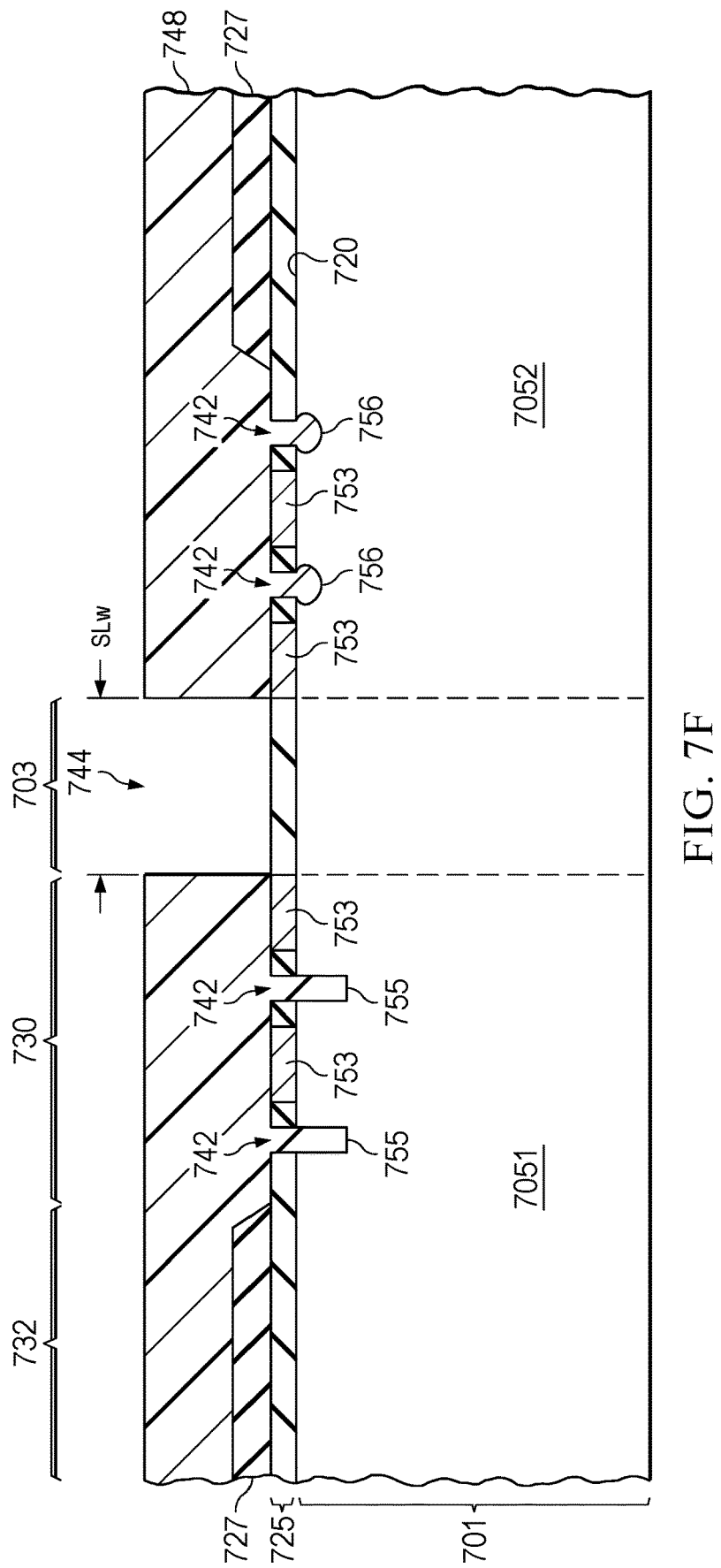

FIG. 7F illustrates, in an additional cross-sectional view, the elements of FIG. 7E after additional processing. A second photoresist layer 748 is deposited and patterned and covers the semiconductor dies 7051, 7052, while an opening 744 is formed exposing the protective overcoat layer 725 over semiconductor wafer 701 in scribe lane 703.

Figure 7G:
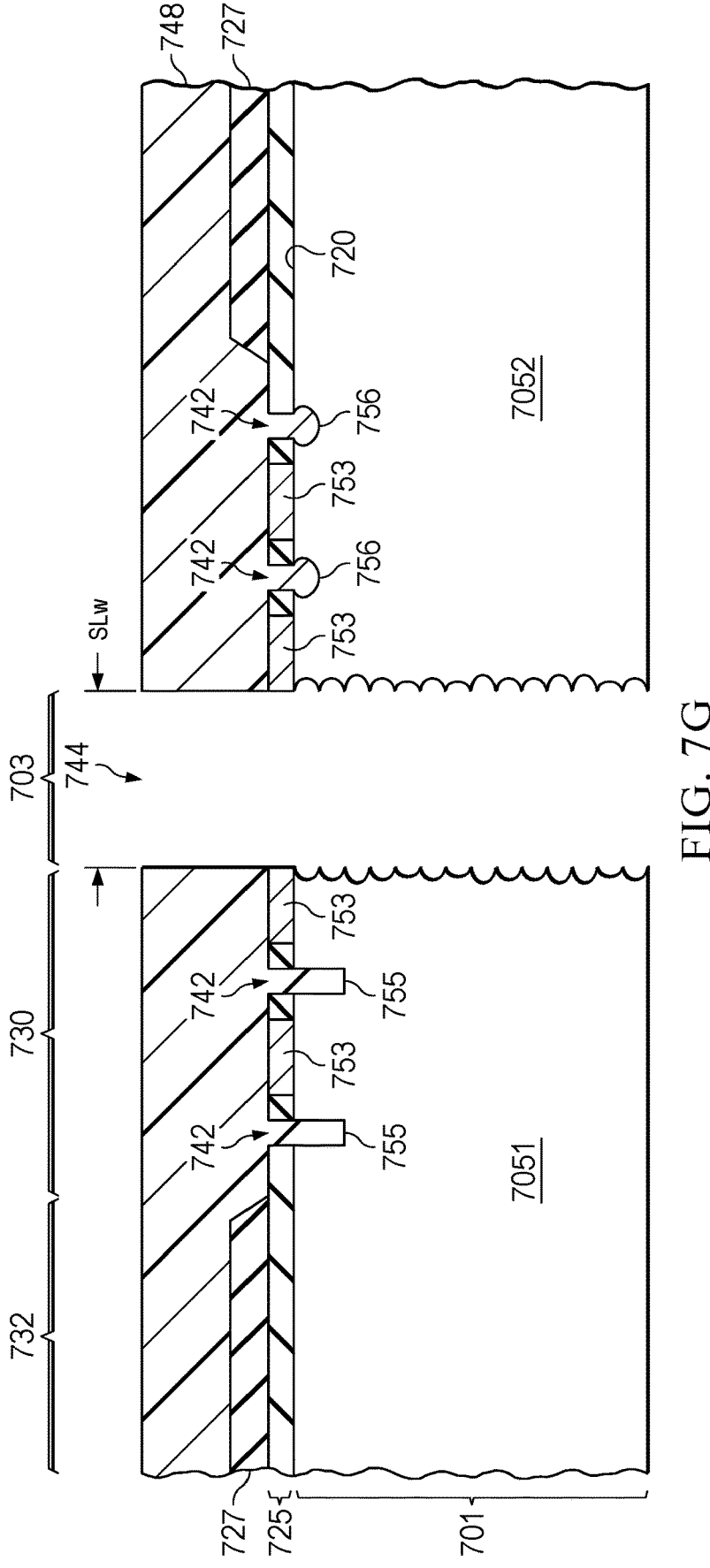

FIG. 7G illustrates, in an additional cross-sectional view, the elements of FIG. 7F after additional processing. In FIG. 7G, a plasma dicing process is used to etch through the semiconductor wafer 701 in the scribe lane 703 while the PR layer 740 protects the semiconductor dies 7051, 7052 from the etch processes. As described above, in a plasma dicing tool, a first dielectric etch using argon, fluorine, or oxygen gasses, for example, can remove the protective overcoat layer 725 in the opening 744. In additional plasma etch processes using the cyclical etch and polymer deposit steps as described above and shown in FIG. 5B, the semiconductor wafer 701 can be etched through in the scribe lane 703, dicing the semiconductor wafer. In the approach of FIG. 7G, the formation of the polymeric anchors is performed prior to the wafer dicing process, in a sequence.

While the illustrated example uses the plasma dicing process, in another alternative approach, after the polymeric anchors 755 or 756 are formed and the photoresist 740 is stripped, the semiconductor wafer can be diced using a mechanical saw or laser cutting tool. However, as described above, plasma dicing has several advantages over other dicing approaches, including a narrower scribe lane requirement, increasing the semiconductor wafer area available for devices. Plasma dicing also dices along all of the scribe lanes on a wafer simultaneously, increasing throughput over multiple pass sawing or laser operations.

Figures 7H, 7I:
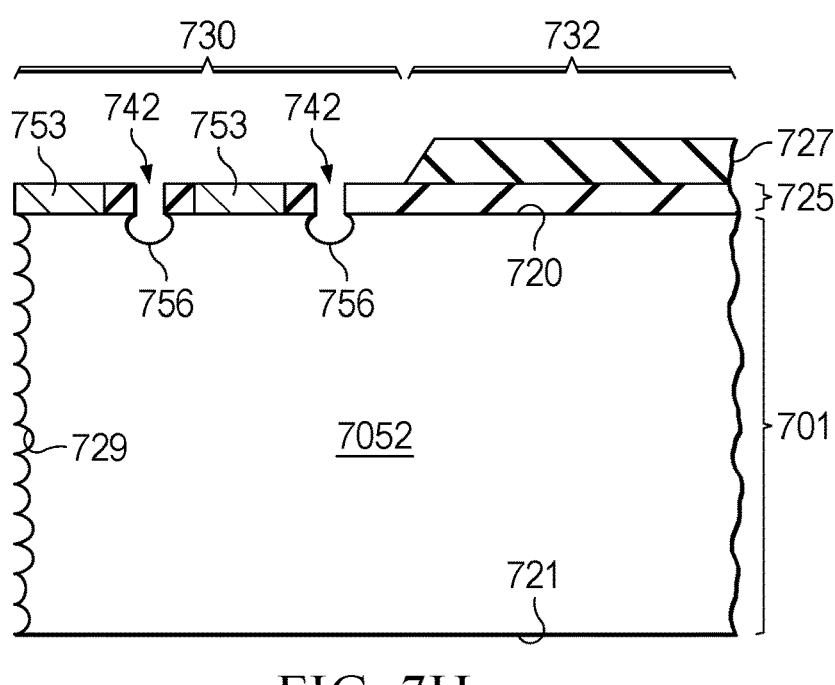
FIG. 7I illustrates, in another close-up cross-sectional view, details of an arrangement of FIG. 7H after additional processing.

FIG. 7H illustrates, in another cross-sectional view, a portion of the semiconductor die 7052 of FIG. 7G, illustrating a die side 729 (showing the scalloped shapes indicative of the plasma dicing process used in the illustrated examples). A polymer sidewall coating is not shown for simplicity of illustration, (see FIG. 5B, coating 541). The scribe seals 753 are shown with polymeric anchors 756 positioned between and inset from the scribe seals. In some examples a scribe seal 753 is only positioned at the edge of the semiconductor die 7052. The protective overcoat 725 is covered by the polyimide layer 727 in the device area, but in the scribe spacing area 730, the polyimide layer 727 is not present.

FIG. 7I illustrates the elements of FIG. 7H after an example molding process covers the semiconductor die 7052 in a polymeric material that is electronic mold compound (as the semiconductor die 7052 is being packaged in a semiconductor device package, for example see FIGS. 4A-4F). When the polymeric material, here mold compound 723, covers the device side of the semiconductor die 7052, the mold compound fills the polymeric anchors 756. The polymeric anchors 756 extend into the semiconductor wafer 701 and will act as crack stops if a crack begins in the protective overcoat layer 725 or in the mold compound 723, so that the crack does not propagate into the device area of the semiconductor die 7052.

FIG. 8 illustrates, in a flow diagram, a method for forming an arrangement. At step 801 the method begins by depositing a photoresist layer over a protective overcoat layer over a semiconductor wafer, the semiconductor wafer having semiconductor dies formed on a device side surface, the semiconductor dies spaced from one another by scribe lanes. (See, for example, FIG. 6B, with PR layer 640).

At step 803, the method continues by patterning the photoresist layer to form openings corresponding to polymeric anchor locations in scribe spacing areas between a device area and the scribe lanes on the device side surface of the semiconductor dies. (See, for example, openings 642 in PR layer 640, in FIG. 6C).

At step 805, the method continues, using the patterned photoresist layer, etching through the protective overcoat layer in the openings to expose the device side surface of the semiconductor wafer at the polymeric anchor locations. (See, for example, the dielectric etch process for PO layer 625 shown in FIG. 6D).

At step 807, the method continues, by using the openings in the patterned photoresist layer, etching into the semiconductor wafer at the polymeric anchor locations to form polymeric anchors, the polymeric anchors being recesses, cavities or trenches extending into the semiconductor wafer. (See, for example, polymeric anchors 645 in FIG. 6E).

At step 809, the method continues by dicing the semiconductor wafer to form individual semiconductor dies, the individual semiconductor dies having four sides formed in the dicing process, the semiconductor dies having the polymeric anchors in scribe spacing areas at the periphery of the semiconductor dies. (See, for example, the dies 6051, 6052, with polymeric anchors 645 in FIG. 6F).

FIG. 9 illustrates, in another flow diagram, an alternative method for forming an arrangement.

In FIG. 9, the method begins at step 901, by depositing a photoresist layer over a protective overcoat layer over a semiconductor wafer, the semiconductor wafer having semiconductor dies formed on a device side surface, the semiconductor dies spaced from one another by scribe lanes defined between the semiconductor dies. (See, for example, FIG. 6B, PR layer 640, scribe lane 603).

The method continues at step 903, patterning the photoresist layer to form openings corresponding to polymeric anchor locations in scribe spacing areas between a device area and the scribe lanes on the device side surface of the semiconductor dies and to form openings in the scribe lanes. (See, for example, FIG. 6C, openings 642, 644 in PR layer 640).

The method continues at step 905, using the openings in the patterned photoresist layer, using a plasma etch process to etch through the protective overcoat layer in the openings to expose the device side surface of the semiconductor wafer at the polymeric anchor locations and in the scribe lanes. (See, for example, the dielectric etch shown in FIG. 6D, at openings 642, 644).

The method then continues at step 907, by using the openings in the patterned photoresist layer, using a plasma process to etch into the semiconductor wafer at the polymeric anchor locations to form polymeric anchors, the polymeric anchors being recesses, cavities or trenches extending into the semiconductor wafer. (See, for example, polymeric anchors 645, in FIG. 6E).

The method completes at step 909, by simultaneously etching through the semiconductor wafer in the scribe lanes, dicing the semiconductor wafer to form individual semiconductor dies, the semiconductor dies having polymeric anchors in scribe spacing areas at the periphery of the semiconductor dies. (See the etch removing semiconductor wafer 601 from scribe lane 603 in FIG. 6E). Because in the method of FIG. 9, the polymeric anchors and the dicing operations are performed simultaneously using a plasma etch process, the sidewalls of the polymeric anchors will have scalloped shapes formed in a cyclical plasma etch process.

The use of the arrangements provides advantages in reducing crack propagation in the scribe area of a semiconductor device where the protective overcoat layer directly contacts a polymeric material such as a mold compound or underfill. In some example arrangements, polymeric anchors that extend through the dielectric layers into the semiconductor substrate are formed in a plasma dicing tool simultaneously with the dicing process. This allows the polymeric anchors to be formed using the same process steps that are used for wafer dicing, and using a same photoresist deposit and pattern step, allowing the arrangements to be formed at little or no additional costs. In alternative arrangements, polymeric anchors are formed in scribe spacing areas at the periphery of the semiconductor die prior to a dicing step using etchants to etch through the protective overcoat layer into the semiconductor substrate. The polymeric anchors can be formed using a plasma etch, or using a wet etch process. The semiconductor wafer is then diced. In some example arrangements, a plasma dicing process is used to dice the semiconductor wafer. In other examples, sawing or a laser cutting tool can be used. When the device side surface of the semiconductor die is subsequently covered with a polymeric material, such as a mold compound, or an underfill material, the polymeric material fills the polymeric anchors and the filled polymeric anchors act as crack stops, reducing or eliminating crack propagation from the protective overcoat layer into the device area of the semiconductor die, preventing defects and device failures that can occur without use of the arrangements.

Modifications are possible in the described arrangements, and other alternative arrangements are possible within the scope of the claims.

What is claimed is:

1. A method of making a semiconductor device, comprising:
depositing a photoresist layer over a protective overcoat layer over a semiconductor wafer, the semiconductor wafer having semiconductor dies formed on a device side surface, the semiconductor dies spaced from one another by scribe lanes;
patterning the photoresist layer to form openings corresponding to polymeric anchor locations in scribe spacing areas between a device area and openings corresponding to the scribe lanes on the device side surface of the semiconductor dies;
using the patterned photoresist layer, etching through the protective overcoat layer in the openings to expose the device side surface of the semiconductor wafer at the polymeric anchor locations;
using the openings in the patterned photoresist layer, etching into the semiconductor wafer at the polymeric anchor locations to form polymeric anchors, the polymeric anchors being recesses extending into the semiconductor wafer; and
dicing the semiconductor wafer to separate the semiconductor dies to form individual semiconductor dies, the individual semiconductor dies having the polymeric anchors in the scribe spacing areas at a periphery of the individual semiconductor dies.

2. The method of claim 1, wherein using the patterned photoresist layer, etching through the protective overcoat layer in the openings further comprises etching through the protective overcoat layer in the scribe lanes.

3. The method of claim 2, wherein using the openings in the patterned photoresist layer, etching into the semiconductor wafer further comprises etching through the semiconductor wafer in the scribe lanes to perform the dicing of the semiconductor wafer.

4. The method of claim 1, wherein using the openings in the patterned photoresist layer, etching into the semiconductor wafer at the polymeric anchor locations, the polymeric anchors being recesses extending into the semiconductor wafer; and the dicing the semiconductor wafer to form individual semiconductor dies are performed simultaneously using a plasma dicing process.

5. The method of claim 4 wherein using the openings in the patterned photoresist layer, etching into the semiconductor wafer at the polymeric anchor locations, the polymeric anchors being recesses extending into the semiconductor wafer; and dicing the semiconductor wafer to form individual semiconductor dies are performed in sequence using a plasma dicing process, the plasma dicing process first forming the polymeric anchors, and subsequently etching through the semiconductor wafer in the scribe lanes to perform the dicing of the semiconductor wafer.

6. The method of claim 1, wherein the polymeric anchors have scallop shaped edges on sidewalls in the semiconductor wafer.

7. The method of claim 1, wherein using the patterned photoresist layer, etching through the protective overcoat layer in the openings to expose the device side surface of the semiconductor wafer at the polymeric anchor locations, and using the openings in the patterned photoresist layer, etching into the semiconductor wafer at the polymeric anchor locations to form polymeric anchors, the polymeric anchors being recesses extending into the semiconductor wafer further comprise etching using wet etch processes.

8. The method of claim 1, wherein using the openings in the patterned photoresist layer, etching into the semiconductor wafer at the polymeric anchor locations to form polymeric anchors comprises forming polymeric anchors that are rectangular in cross section.

9. The method of claim 1, wherein using the openings in the patterned photoresist layer, etching into the semiconductor wafer at the polymeric anchor locations to form polymeric anchors comprises forming polymeric anchors that are oval or circular in cross section.

10. The method of claim 1, and further comprising:

mounting an individual semiconductor die to a package substrate; and covering at least a portion of the individual semiconductor die with a polymeric material, the polymeric material filling the recesses of the polymeric anchors to form filled polymeric anchors.

11. The method of claim 10, wherein the polymeric material is electronic mold compound, epoxy, resin, resin epoxy, or underfill material.

12. The method of claim 11, wherein the polymeric material is underfill material that comprises epoxy with silica filler.

13. The method of claim 1, wherein patterning the photoresist layer to form openings corresponding to polymeric anchor locations in scribe spacing areas between a device area and the scribe lanes on the device side surface of the semiconductor dies further comprises forming openings corresponding to polymeric anchor locations in corner regions of the semiconductor dies.

14. The method of claim 1, wherein using the openings in the patterned photoresist layer, etching into the semiconductor wafer at the polymeric anchor locations to form polymeric anchors, the polymeric anchors being recesses extending into the semiconductor wafer further comprises forming polymeric anchors that are open trenches in the scribe spacing areas.

15. A method of making a semiconductor device, comprising:

depositing a photoresist layer over a protective overcoat layer over a semiconductor wafer, the semiconductor wafer having semiconductor dies formed on a device side surface, the semiconductor dies spaced from one another by scribe lanes defined between the semiconductor dies;

patterning the photoresist layer to form openings corresponding to polymeric anchor locations in scribe spacing areas between a device area and the scribe lanes on the device side surface of the semiconductor dies and to form openings in the scribe lanes;

using the openings in the patterned photoresist layer, using a plasma etch process to etch through the protective overcoat layer in the openings to expose the device side surface of the semiconductor wafer at the polymeric anchor locations and in the scribe lanes;

using the openings in the patterned photoresist layer, using the plasma etch process to etch into the semiconductor wafer at the polymeric anchor locations to form polymeric anchors, the polymeric anchors being recesses extending into the semiconductor wafer; and simultaneously etching through the semiconductor wafer in the scribe lanes, dicing the semiconductor wafer to form individual semiconductor dies, the individual semiconductor dies having the polymeric anchors in scribe spacing areas at the periphery of the individual semiconductor dies.

16. The method of claim 15, wherein the polymeric anchors comprise recesses that have vertical sidewalls with scalloped sides.

17. The method of claim 15, wherein the semiconductor dies have vertical sides with scalloped sides.

18. The method of claim 15, wherein the polymeric anchor locations are in the scribe spacing areas at corners of the semiconductor dies.

19. The method of claim 15, and further comprising:

mounting a selected individual semiconductor die to a package substrate; and covering at least a portion of the selected individual semiconductor die with a polymeric material, the polymeric material filling the recesses of the polymeric anchors to form filled polymeric anchors.

20. The method of claim 19, wherein covering at least a portion of the selected individual semiconductor die with a polymeric material further comprises the polymeric material that is electronic mold compound, epoxy, resin, resin epoxy, or underfill material.

21. The method of claim 19, wherein the polymeric material is underfill material that is epoxy with silica fillers.

* * * * *